(12) United States Patent
Ishii et al.

(10) Patent No.: US 7,164,523 B2
(45) Date of Patent: Jan. 16, 2007

(54) IMAGE EXPOSURE SYSTEM

(75) Inventors: Shuichi Ishii, Kanagawa-ken (JP); Hiromi Ishikawa, Kanagawa-ken (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 11 days.

(21) Appl. No.: 11/020,661

(22) Filed: Dec. 27, 2004

(65) Prior Publication Data
US 2005/0168823 A1    Aug. 4, 2005

(30) Foreign Application Priority Data
Dec. 26, 2003  (JP)  ............... 2003-433799
Jan. 5, 2004   (JP)  ............... 2004-000396

(51) Int. Cl.
G02B 26/00  (2006.01)
G02B 27/10  (2006.01)

(52) U.S. Cl. .................... 359/290; 359/618

(58) Field of Classification Search ........... 359/619, 359/663, 676, 679, 649–651, 618, 629, 636, 359/642, 722, 726, 736, 290, 291, 292
See application file for complete search history.

(56) References Cited

U.S. PATENT DOCUMENTS 6,026,053 A * 2/2000 Satorius ............... 365/235
6,473,236 B1 * 10/2002 Tadic-Galeb et al. ....... 359/618
6,960,035 B1 * 11/2005 Okazaki et al. ........... 385/96

FOREIGN PATENT DOCUMENTS

JP     2001-305663 A    11/2001

\* cited by examiner

*Primary Examiner*—Hung X. Dang
*Assistant Examiner*—Tuyen Tra
(74) *Attorney, Agent, or Firm*—Sughrue Mion, PLLC

(57) ABSTRACT

An image exposure system is formed by a spatial light modulator element comprising a number of two-dimensionally arranged pixel portions each modulating light projected thereon, a light source which projects light onto the spatial light modulator element and an imaging optical system which includes a micro lens array and forms on a photosensitive material an image of light modulated by the spatial light modulator element, the micro lens array being made up of micro lenses which are arranged like an array and collect light from the pixel portions of the spatial light modulator element. Each micro lens of the micro lens array has an aspherical surface or a refractive index profile which corrects aberration due to distortion of the pixel portions or has a shape of lens aperture which does not permit light from a periphery of each of the pixel portions of the spatial light modulator element.

29 Claims, 26 Drawing Sheets

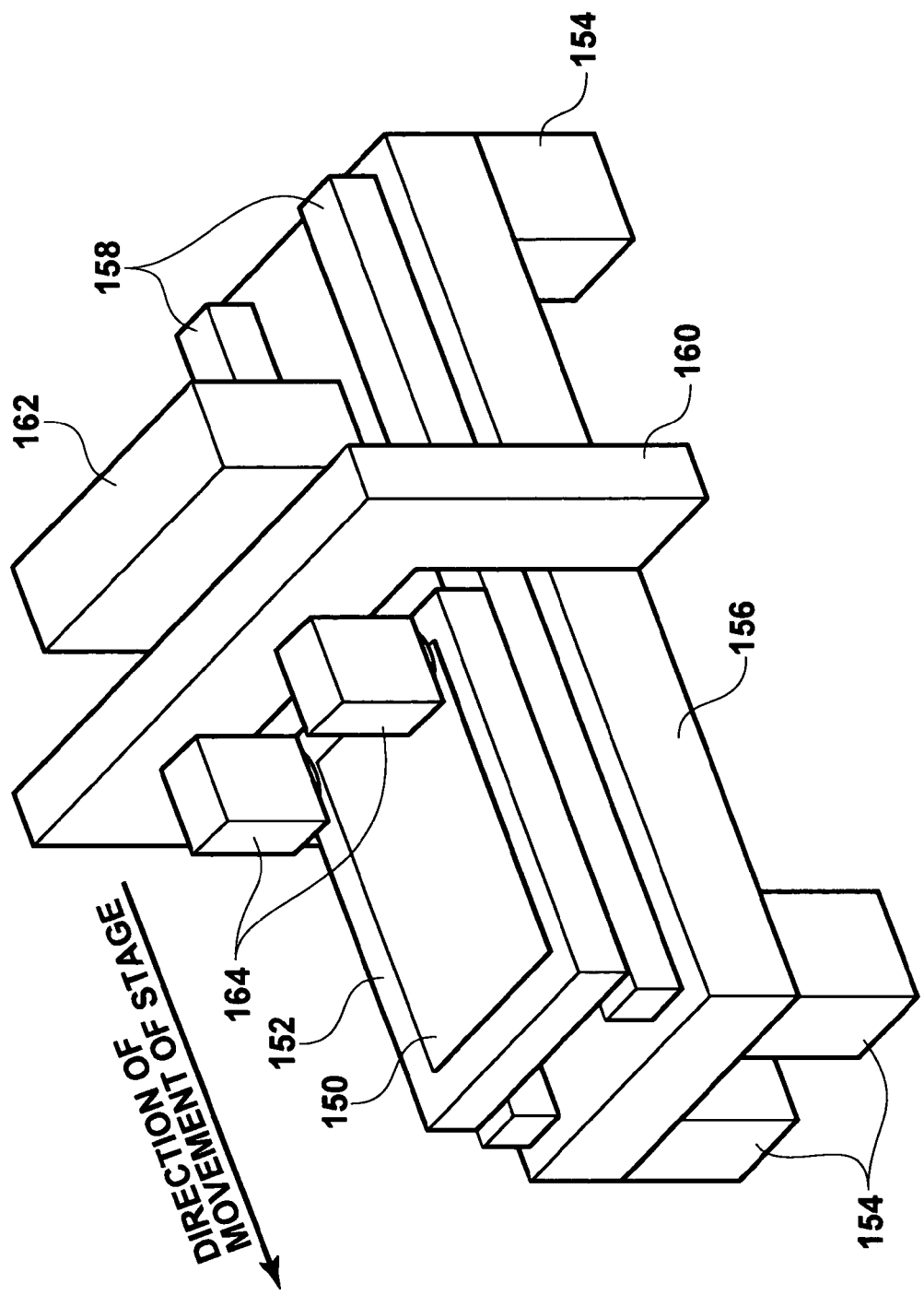

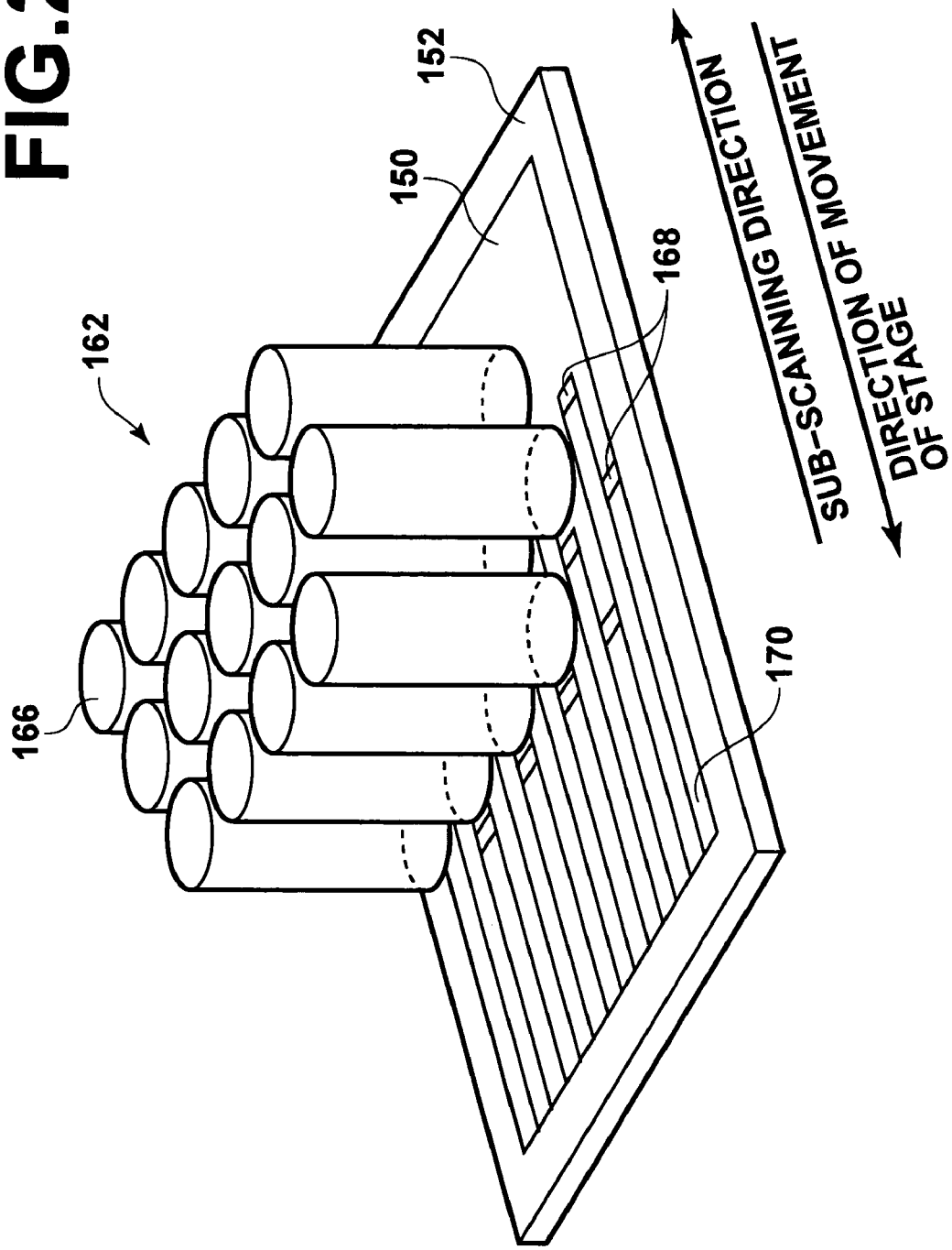

EXPOSED AREA

SUB-SCANNING DIRECTION
ONE CONSTANT LOW SPEED SCANNING(40mm/s)

m ROWS n COLUMNS

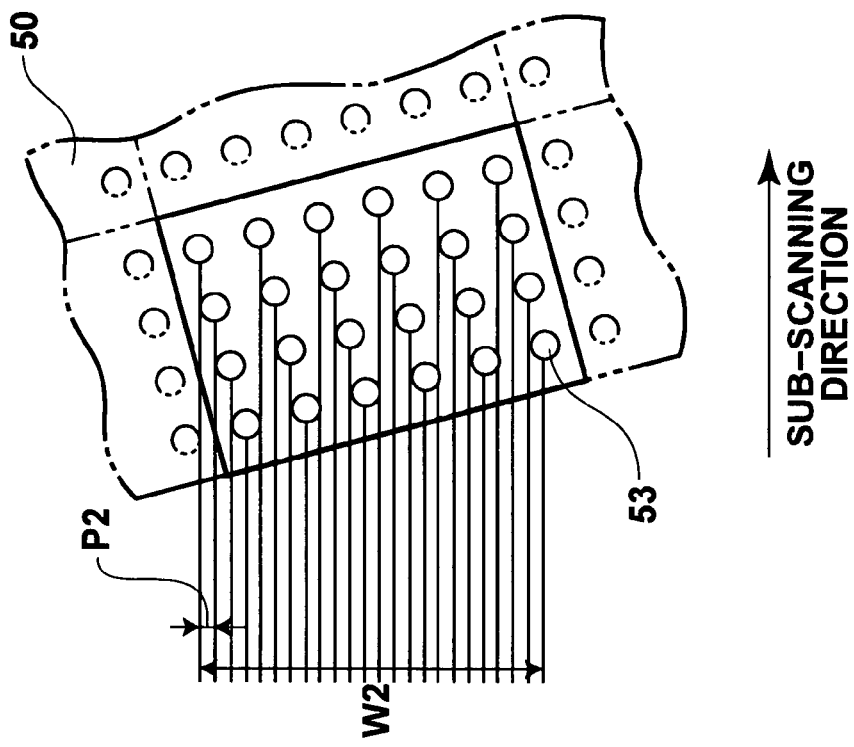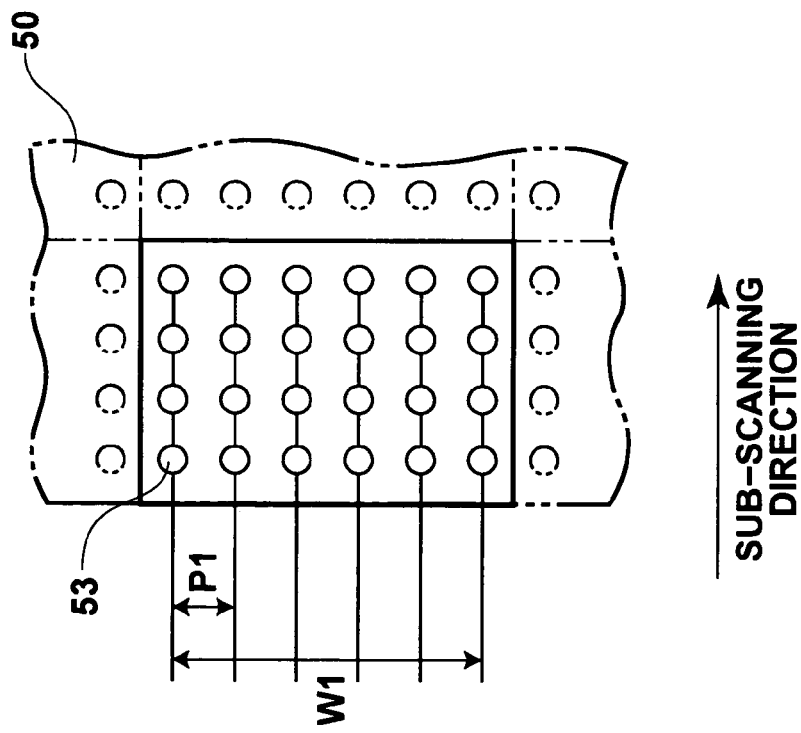

x DIRECTION
(DIRECTION OF ROTATION)
CROSS-SECTION y DIRECTION
(DIRECTION OF AXIS OF ROTATION)
CROSS-SECTION z=0.18mm z=0.2mm z=0.22mm z=0.24mm z=0.18mm z=0.2mm z=0.22mm z=0.24mm

IMAGE EXPOSURE SYSTEM

BACKGROUND OF THE INVENTION

1. Field of the Invention

This invention relates to an image exposure, and more particularly to an image exposure system and an image exposure method which pass light modulated by a spatial light modulator element through an imaging optical system to form an image of light on a photosensitive material and expose the photosensitive material.

2. Description of the Related Art

Conventionally, there has been known an image exposure system in which light modulated by a spatial light modulator element is passed through an imaging optical system to form an image of light on a photosensitive material to expose the photosensitive material to the image of light. The image exposure system of this kind basically comprises a spatial light modulator element comprising a number of two-dimensionally arranged pixel portions each modulating according to a control signal light projected thereon, a light source which projects light onto the spatial light modulator element and an imaging optical system which forms on a photosensitive material an image of light modulated by the spatial light modulator element. An example of such a basic arrangement of the image exposure system of this kind is disclosed in "Shortening of Development and Application of Mass Production by Maskless Exposure" ("Electronics Mounting Technology" Technology Investigation Co. Ltd. by Akihito Ishikawa vol. 18, No. 6, 2002, pp. 74–79) or in our Japanese Patent Application No. 2002-149886.

In the image exposure systems of this kind, LCDs (liquid crystal display) or DMDs (a distal micro mirror device) are suitably employed as the spatial light modulator element. "DMD" is a mirror device comprising a number of micro mirrors each of which changes the angle of its reflecting surface according to the control signal and which are two-dimensionally arranged on a semiconductor substrate such as silicon.

In such image exposure systems, there often follows a demand for enlargement of the image projected onto the photosensitive material. In this case, an enlarging imaging optical system is employed as the imaging optical system. However, when the light modulated by the spatial light modulator element is simply passed through the enlarging imaging optical system, the light bundles from the spatial light modulator element are enlarged and the pixel size in the projected image is increased, whereby the sharpness of the image deteriorates.

In order to overcome this problem, it is conceivable to dispose a first imaging optical system on the optical path of light modulated by the spatial light modulator element and to dispose a micro lens array on the imaging plane of the first imaging optical system so that each of the micro lenses of the micro lens array corresponds to each of the pixel portions of the spatial light modulator element as disclosed in the above identified Japanese patent application. In the image exposure system disclosed in the Japanese patent application, a second imaging optical system is disposed on the optical path of light passing through the micro lens array to form an image by the modulated light on the photosensitive material or a screen, and the image is enlarged by the first and second imaging optical systems. With this arrangement, though the size of the image projected onto the photosensitive material or the screen is enlarged, light from each of the pixel portions of the spatial light modulator element is converged by the micro lens of the micro lens array. Accordingly, the pixel size (spot size) in the projected image is kept small and the sharpness of the image can be held high.

Japanese Unexamined Patent Publication No. 2001-305663 discloses an example of the image exposure system in which a DMD is employed as the spatial light modulator element and a combination of the DMD and a micro lens array is employed. However, in the conventional image exposure system which employs a combination of the spatial light modulator element and the micro lens array, there has been a problem that the shape of the light beam collected by each of the micro lenses of the micro lens array is distorted in the light collecting position. This problem is more serious when the DMD is employed as the spatial light modulator element.

SUMMARY OF THE INVENTION

In view of the foregoing observations and description, the primary object of the present invention is to prevent distortion of the light beam collected by the micro lenses of the micro lens array in the image exposure system which employs a combination of the spatial light modulator element and the micro lens array.

Another object of the present invention is to provide an image exposure method which can prevent distortion of the light beam collected by the micro lenses of the micro lens array in the image exposure system which employs a combination of the spatial light modulator element and the micro lens array.

In accordance with a first aspect of the present invention, there is provided a first image exposure system comprising a spatial light modulator element comprising a number of two-dimensionally arranged pixel portions each modulating light projected thereon, a light source which projects light onto the spatial light modulator element and an imaging optical system which includes a micro lens array and forms on a photosensitive material an image by light modulated by the spatial light modulator element, the micro lens array being made up of micro lenses which are arranged like an array and collect light from the pixel portions of the spatial light modulator element, wherein the improvement comprises that each micro lens of the micro lens array is of an aspherical surface which corrects aberration due to distortion of the pixel portions.

As the aspherical surface, a toric surface is suitable.

In accordance with a second aspect of the present invention, there is provided a second image exposure system comprising a spatial light modulator element comprising a number of two-dimensionally arranged pixel portions each modulating light projected thereon, a light source which projects light onto the spatial light modulator element and an imaging optical system which includes a micro lens array and forms on a photosensitive material an image by light modulated by the spatial light modulator element, the micro lens array being made up of micro lenses which are arranged like an array and collect light from the pixel portions of the spatial light modulator element, wherein the improvement comprises that each micro lens of the micro lens array has a refractive index distribution which corrects aberration due to distortion of the pixel portions.

In accordance with a third aspect of the present invention, there is provided a third image exposure system comprising a spatial light modulator element comprising a number of two-dimensionally arranged pixel portions each modulating light projected thereon, a light source which projects light onto the spatial light modulator element and an imaging optical system which includes a micro lens array and forms on a photosensitive material an image by light modulated by the spatial light modulator element, the micro lens array being made up of micro lenses which are arranged like an array and collect light from the pixel portions of the spatial light modulator element, wherein the improvement comprises that each micro lens of the micro lens array has a shape of lens aperture which does not permit light from a periphery of each of the pixel portions of the spatial light modulator element.

It is especially preferred that the third image exposure system be also provided with the features of the first image exposure and each micro lens of the micro lens array be of an aspherical surface which corrects aberration due to distortion of the pixel portions. In this case, it is preferred that the aspherical surface be a toric surface.

Further, it is especially preferred that the third image exposure system be also provided with the features of the second image exposure and each micro lens of the micro lens array has a refractive index distribution which corrects aberration due to distortion of the pixel portions.

Further, in the third image exposure system, it is preferred that each micro lens of the micro lens array has a circular lens aperture.

Otherwise, in the third image exposure system, it is preferred that the shape of lens aperture of each micro lens of the micro lens array be defined by a light-shielding portion provided on a part of its lens face.

Further, in the first to third image exposure systems, when the imaging optical system comprises a first imaging optical system which forms an image by the light modulated by the spatial light modulator element on the micro lens array and a second imaging optical system which forms an image by the light collected by the micro lens array on the photosensitive material, it is preferred that the imaging position of the first imaging optical system be on the lens face of the micro lens array.

Further, in the first to third image exposure systems, when the imaging optical system comprises a first imaging optical system and a second imaging optical system the same as those described above, it is preferred that an aperture array comprising a number of apertures arranged in an array each stopping the light emanating from the micro lens independently of other apertures be disposed between the micro lens array and the second imaging optical system.

Further, in the first to third image exposure systems of the present invention, it is preferred that the spatial light modulator element be in the form of a DMD (digital micro mirror device) comprising a plurality of micro mirrors two-dimensionally arranged to form the pixel portions.

The image exposure method of the present invention is characterized in that a photosensitive material is exposed in a predetermined pattern by the use of the image exposure system of the present invention.

These inventor's investigation has revealed that the problem that the shape of the light beam collected by each of the micro lenses of the micro lens array is distorted in the light collecting position is due to distortion of the surface of the pixel portion of the spatial light modulator element. Especially, in the DMD, the reflecting surfaces of the micro mirrors forming the pixel portions have been considered to be accurately flat. However, these inventor's analysis has revealed that the reflecting surfaces are substantially distorted, which makes the above problem more apt to occur when the DMD is employed as the spatial light modulator element.

On the basis of the above recognition, in the first image exposure system of the present invention, each micro lens of the micro lens array is of an aspherical surface which corrects aberration due to distortion of the pixel portions. With this arrangement, the problem due to distortion of the surface of the pixel portion of the spatial light modulator element, i.e., that the shape of the light beam collected by each of the micro lenses of the micro lens array is distorted in the light collecting position, can be prevented.

Further, on the basis of the above recognition, in the second image exposure system of the present invention, each micro lens of the micro lens array has a refractive index distribution which corrects aberration due to distortion of the pixel portions. With this arrangement, the problem due to distortion of the surface of the pixel portion of the spatial light modulator element, i.e., that the shape of the light beam collected by each of the micro lenses of the micro lens array is distorted in the light collecting position, can be also prevented.

By preventing the shape of the light beam collected by each of the micro lenses of the micro lens array from being distorted in the light collecting position in the manner described above, the exposed image can be of higher definition and free of distortion.

These inventor's investigation has further revealed that the rate of change of distortion of each rectangular micro mirror forming the pixel portion in DMD tends to increase toward the periphery of the pixel portion from the center thereof and when the DMD is employed as the spatial light modulator element, the above problem is more apt to occur.

On the basis of the above recognition, in the third image exposure system of the present invention, each micro lens of the micro lens array has a shape of lens aperture which does not permit light from a periphery of each of the rectangular pixel portions of the spatial light modulator element. Accordingly, in the third image exposure system of the present invention, the light passing through the periphery of the pixel portion where the rate of change of distortion is large is not collected by the micro lens and the problem that the shape of the light beam collected by each of the micro lenses of the micro lens array is distorted in the light collecting position of the collected light beam can be avoided.

By preventing the shape of the light beam collected by each of the micro lenses of the micro lens array from being distorted in the light collecting position in the manner described above, the exposed image can be of higher definition and free of distortion.

When each micro lens of the micro lens array is of an aspherical surface which corrects aberration due to distortion of the pixel portions in the third image exposure system, the effect of the first image exposure system can be further obtained. Accordingly, the exposed image can be of further higher definition and further free of distortion.

Further, when each micro lens of the micro lens array has a refractive index distribution which corrects aberration due to distortion of the pixel portions in the third image exposure system, the effect of the second image exposure system can be further obtained. Accordingly, the exposed image can be of further higher definition and further free of distortion.

Further, when the shape of lens aperture of each micro lens of the micro lens array is defined by a light-shielding portion provided on a part of its lens face in the third image exposure system, the light passing through the periphery of the pixel portion is cut by the light-shielding portion. Accordingly, the problem that the shape of the light beam collected by each of the micro lenses of the micro lens array is distorted in the light collecting position of the collected light beam can be more surely avoided.

Further, in the first to third image exposure systems, when the imaging optical system comprises a first imaging optical system which forms an image by the light modulated by the spatial light modulator element on the micro lens array and a second imaging optical system which forms an image by the light collected by the micro lens array on the photosensitive material, and the imaging position of the first imaging optical system is on the lens face of the micro lens array, the image of the pixel portions formed on the lens face of the micro lens array by the first imaging optical system is minimized. With this arrangement, the light beam can be minimized on the photosensitive material and accordingly, the exposed image can be of high definition. Further, since the pixel portion such as a micro mirror of the DMD is generally least in distortion near the center thereof, when the image of the pixel portions formed on the lens face of the micro lens array by the first imaging optical system is minimized, the light converging performance by the micro lenses can be improved by causing only light from the vicinity of the center of the pixel portions which is less in aberration to pass through the micro lenses.

Further, when the imaging position of the first imaging optical system is on the lens face of the micro lens array, the light utilizing efficiency can be increased and the photosensitive material can be exposed to more intensive light by providing a part of each of the micro lenses with a light-shielding portion so that each of the micro lenses has a shape of lens aperture which does not permit light from a periphery of each of the rectangular pixel portions of the spatial light modulator element and causing the micro lens to have an aspherical surface or a refractive index distribution which corrects aberration due to distortion of the pixel portions. That is, the light is refracted by the first imaging optical system so that the stray light due to distortion of the surface of the pixel portion is converged on a point in the imaging position of the first imaging optical system. However, when the light-shielding portion which limits aperture of each micro lens is formed in this position, light other than the stray light cannot be cut, whereby the light utilizing efficiency can be increased.

Further, in the first to third image exposure systems, when the imaging optical system comprises a first imaging optical system and a second imaging optical system the same as those described above and an aperture array comprising a number of apertures arranged in an array each stopping the light emanating from the micro lens independently of other apertures is disposed between the micro lens array and the second imaging optical system, light from adjacent micro lenses not corresponding to a given aperture is prevented from entering the aperture, the extinction ratio can be increased. This effect is especially remarkable when the aperture array is disposed on a focusing position of the micro lens.

When the spatial light modulator element is in the form of a DMD (digital micro mirror device) comprising a plurality of two-dimensionally arranged micro mirrors in the first to third image exposure systems of the present invention, the above problem which is especially apt to occur in the case where the spatial light modulator element is in the form of a DMD can be avoided.

Further, in the image exposure method of the present invention, a photosensitive material is exposed in a predetermined pattern by the use of the image exposure system of the present invention. Accordingly, the shape of the light beam collected by each of the micro lenses of the micro lens array can be prevented from being distorted in the light collecting position, and the exposed image can be of higher definition.

BRIEF DESCRIPTION OF DRAWINGS

FIG. 1 is a perspective view showing an appearance of an image exposure system in accordance with an embodiment of the present invention, FIG. 2 is a perspective view showing the scanner employed in the image exposure system of FIG. 1, FIGS. 8A and 8B are plan views for comparing the arrangement of the exposure beam and the scanning lines in the case where the DMD is inclined and in the case where the DMD is not inclined.

DESCRIPTION OF THE PREFERRED EMBODIMENT

Figure 3A:
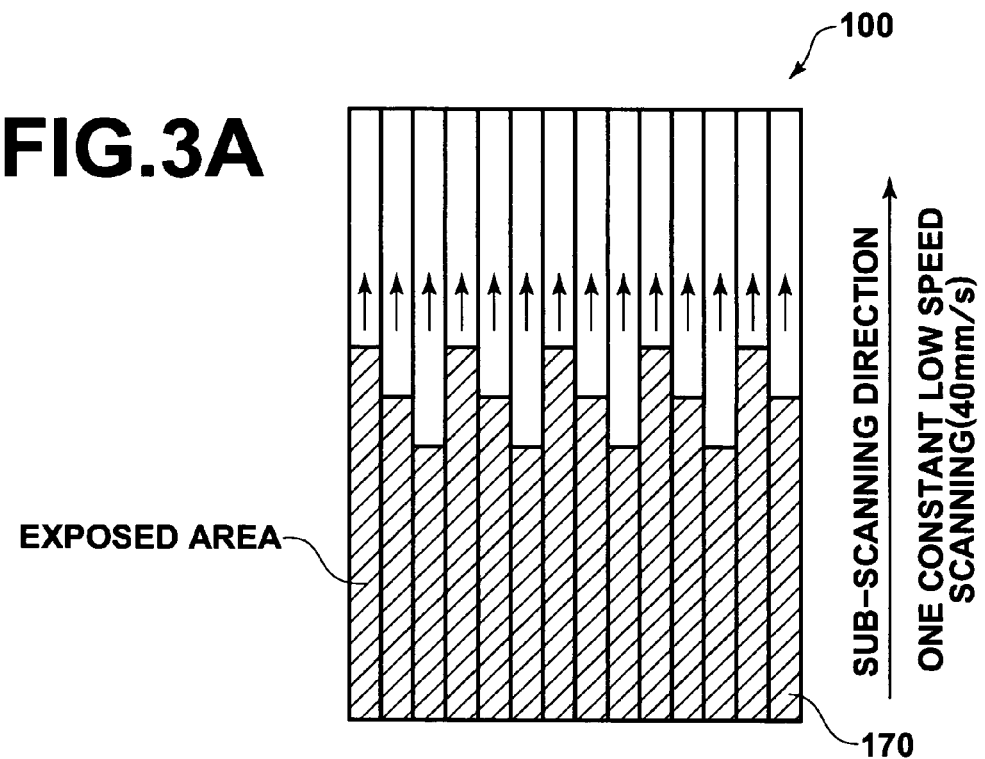
FIG. 3A is a plan view showing the area which has been exposed formed in the photosensitive material.

In FIG. 1, an image exposure system in accordance with an embodiment of the present invention is provided with a plate-like movable stage 152 which attracts a photosensitive material 150 in the form of a sheet against its surface, thereby holding the photosensitive material 150. A thick plate-like table 156 is supported by four legs 154 and a pair of guides 158 extends in the direction of movement of the movable stage 152 on the upper surface of the table 156. The movable stage 152 is disposed so that its longitudinal direction is directed toward the direction of movement of the movable stage 152 and is movable back and forth along the guides 158. The image exposure system is further provided with a stage drive unit 304 (FIG. 15) to be described later which drives the movable stage 152 along the guides 158 as a sub-scanning means.

A substantially U-shaped gate 160 extends across the path of movement of the movable stage 152 at the center of the table 156. The opposite ends of the gate 160 are respectively fixed to the corresponding side surfaces of the table 156. On one side of the gate 160, a scanner 162 is provided, and on the other side of the gate 160, a plurality of (e.g., two) sensors 164 for detecting the leading end and the trailing end of the photosensitive material 150 are provided. The scanner 162 and the sensors 164 are mounted on the gate 160 and fixed above the path of movement of the movable stage 152. Further, the scanner 162 and the sensors 164 are connected to a controller (not shown) for controlling them.

Figure 3B:
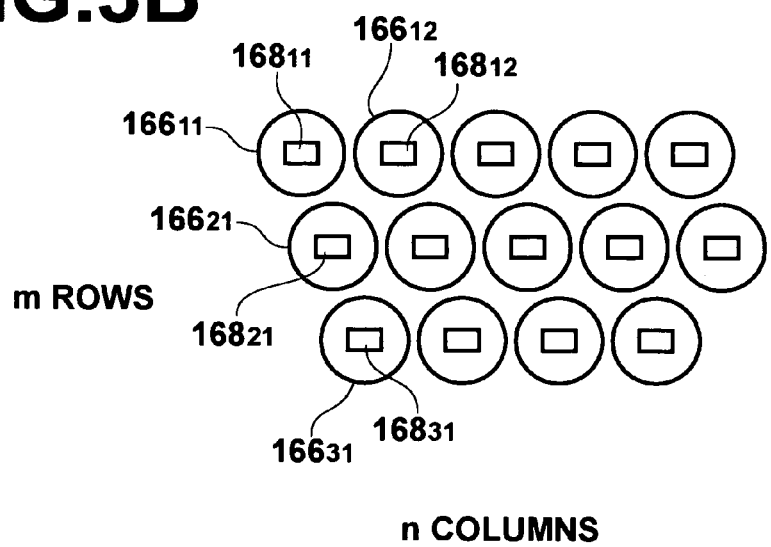
FIG. 3B is a view showing the arrangement of the areas exposed by the exposure heads.

As shown in FIGS. 2 and 3B, the scanner 162 is provided with a plurality (e.g., 14) of exposure heads 166 which are substantially arranged in a matrix of m rows×n columns (e.g., 3 rows×5 columns). In this example, 4 exposure heads 166 are provided along the third row taking into account the width of the photosensitive material 150. The exposure head disposed on the m-th row, n-th column is referred to as the "exposure head $166_{mn}$".

The exposure area 168 by the exposure head 166 is of a rectangle having a shorter side along the sub-scanning direction. As the movable stage 152 is moved, strip-like exposed areas 170 are formed on the photosensitive material 150 by each exposure head 166. The area exposed by the exposure head provided on the m-th row, n-th column is referred to as the "exposure area $168_{mn}$".

As shown in FIGS. 3A and 3B, so that strip-like exposed areas 170 are contiguously arranged side by side in a direction perpendicular to the sub-scanning direction, the exposure heads 166 on a given row are disposed shifted with respect to the adjacent exposure heads 166 on the adjacent rows in the direction of arrangement by a predetermined distance (a natural number of times the longer side of the exposure area: twice in this particular example). With this arrangement, the area between the exposure area $168_{11}$ and the exposure area $168_{12}$ on the first row which cannot be exposed can be exposed by the first exposure head 166 on the second row and the first exposure head 166 on the third row (that is, covered by the exposure area $168_{21}$ on the second row and the exposure area $168_{31}$ on the third row).

Figure 4:
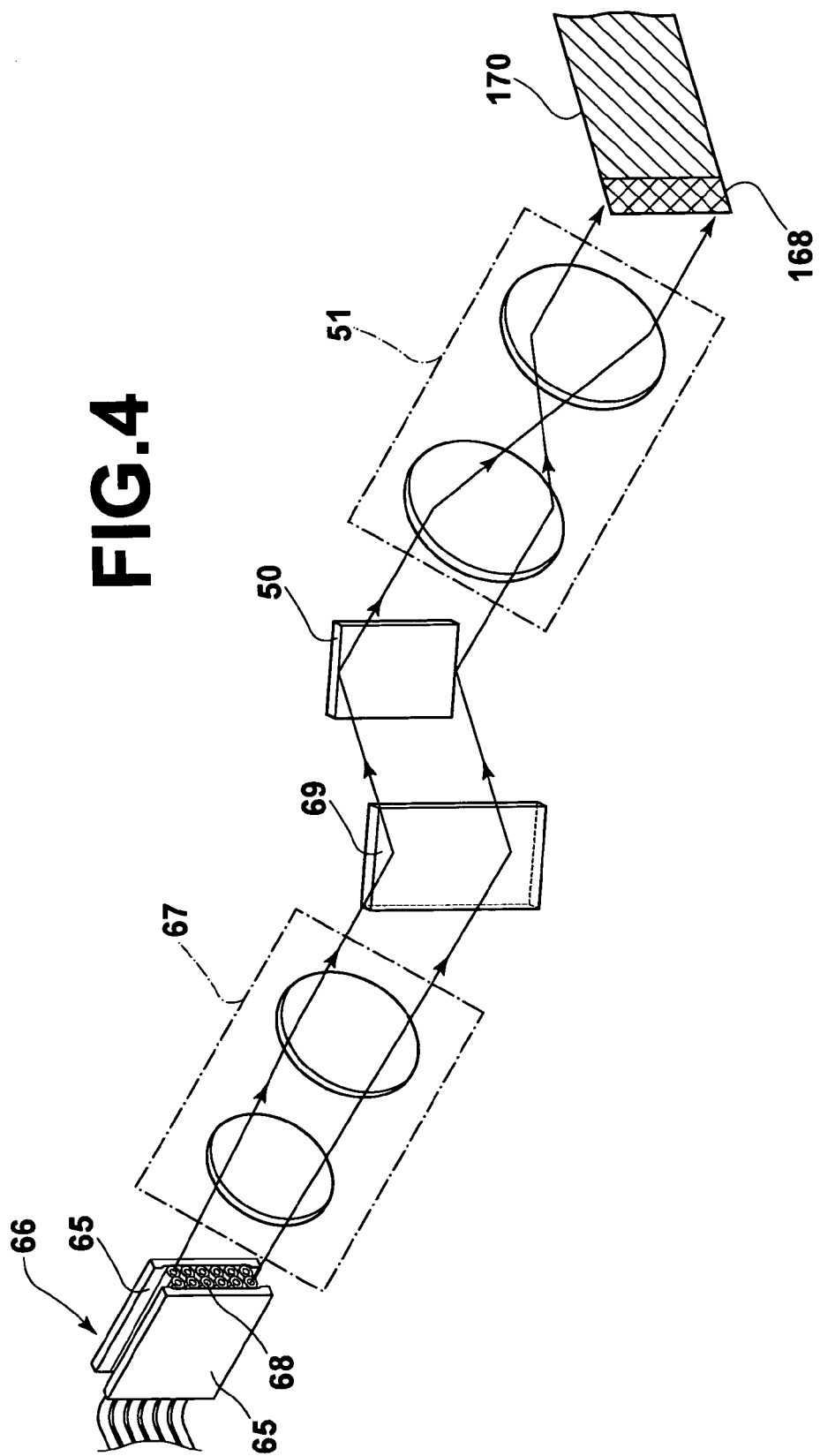
FIG. 4 is a perspective view schematically showing the arrangement of the exposure head employed in the image exposure system of FIG. 1.
Figure 5:
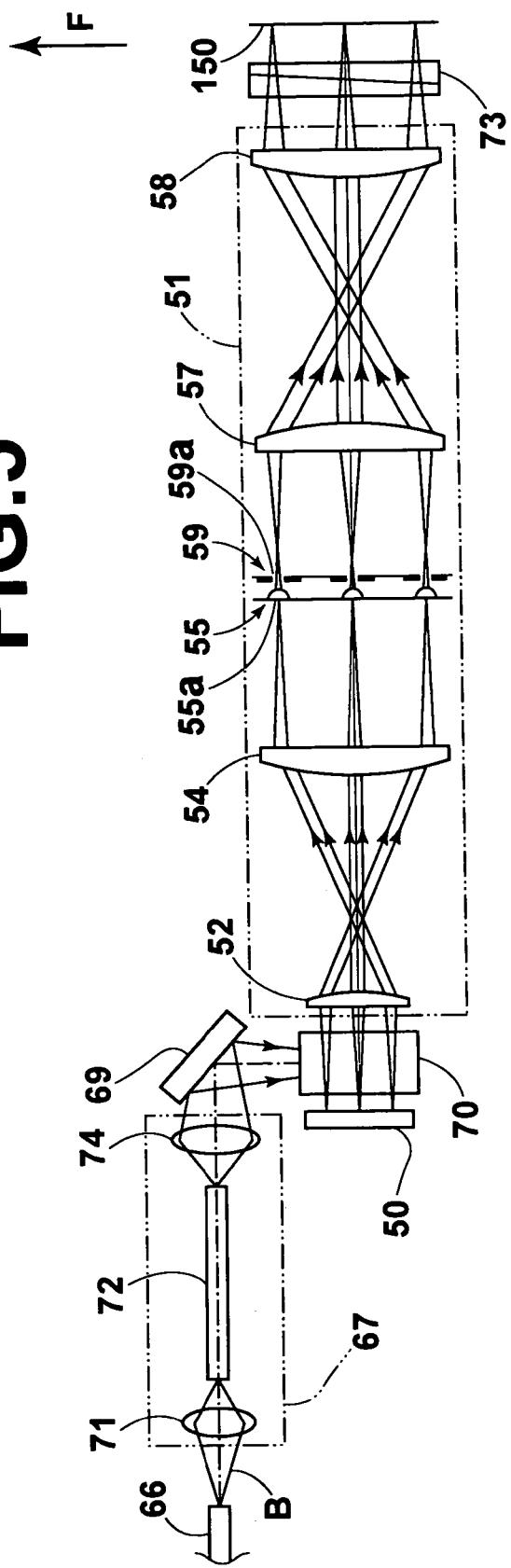
FIG. 5 is a cross-sectional view of the exposure head.

As shown in FIGS. 4 and 5, each of the exposure heads $166_{11}$ to $166_{mn}$ is provided with a digital micro mirror device (DMD) 50 from Texas Instruments (United States) as a spatial light modulator element which modulates by the pixels the entering light beam according to the image data. The DMD 50 is connected to a controller 302 (to be described later with reference to FIG. 15) comprising a data processing portion and a mirror drive portion. In the data processing portion of the controller 302, control signals for driving each of the micro mirrors in an area to be controlled by the DMD 50 are generated. The area to be controlled will be described later. In the mirror drive portion, each of the micro mirrors of the DMD 50 for the corresponding exposure head 166 is controlled in the angle of its reflecting surface on the basis of the control signals generated in the data processing portion. The control of the angle of the reflecting surface of each micro mirror will be described later.

On the light incident side of the DMD 50, a fiber array light source 66 provided with a laser beam emitting portion in which a plurality of light exit ends (light emitting points) of optical fibers are arranged in a row along a direction corresponding a longer side of the exposure area 168, a lens system 67 which corrects laser beams emitted from the fiber array light source 66 and converges them on the DMD 50 and a mirror 69 which reflects toward the DMD 50 the light passing through the lens system 67 are disposed in this order. In FIG. 4, the lens system 67 is schematically shown.

As shown in FIG. 5, the lens system 67 comprises a collective lens 71 which collects the laser beam B emitted from the fiber array light source 66 as illumination light, a rod-like optical integrator (will be referred to as "rod integrator", hereinbelow) 72 inserted into the optical path of light passing through the collective lens 71, and an imaging lens 74 which is disposed downstream of the rod integrator 72, or the side of the mirror 69 of the rod integrator 72. The collective lens 71, the rod integrator 72 and the imaging lens 74 causes light emitted from the fiber array light source 66 as a light bundle which is substantially parallel light and is uniform in intensity in a given beam cross-section. The shape and operation of the rod integrator 72 will be described in detail later.

The laser beam B emitted from the lens system 67 is reflected by the mirror 69 to impinge upon the DMD 50 through a TIR (total internal reflection) prism 70. The TIR prism 70 is abbreviated in FIG. 4.

On the light reflection side of the DMD 50, an imaging optical system 51 for imaging the laser beam B reflected by the DMD 50 on the photosensitive material 150. As shown in detail in FIG. 5 (schematically shown in FIG. 4), the imaging optical system 51 comprises a first imaging optical system consisting of lens systems 52 and 54, a second imaging optical system consisting of lens systems 57 and 58, and a micro lens array 55 and an aperture array 59 inserted between the first and second imaging optical systems.

The micro lens array 55 comprises a number of two-dimensionally arranged micro lenses 55a each corresponding one pixel of the DMD 50. Since 1024×256 micro mirrors of the DMD 50 out of 1024×768 micro mirrors of the DMD 50 are only driven, the micro lenses 55a are arranged in 1024 pieces×256 columns. The micro lenses 55a are arranged at intervals of 41 μm in both the longitudinal and transverse directions of the image exposure system. Each of the micro lenses 55a may be, for instance, 0.19 mm in focal length and 0.11 in numerical aperture, and formed of optical glass BK7. The shape of each micro lens 55a will be described in detail later. The beam diameter of the laser beam B in the position of each micro lens 55a is 41 μm.

The aperture array 59 comprises a number of apertures 59a each corresponding to one of the micro lenses 55a of the micro lens array 55. The diameter of each aperture 59a is 10 μm in this particular embodiment.

The first imaging optical system enlarges the image by the DMD 50 to the size of three times and images it on the micro lens array 55. The second imaging optical system enlarges the image on the micro lens array 55 to the size of 1.6 times and images it on the photosensitive material 150. That is, an image which is 4.8 times the image by the DMD 50 in size is imaged on the photosensitive material 150.

Figure 6:
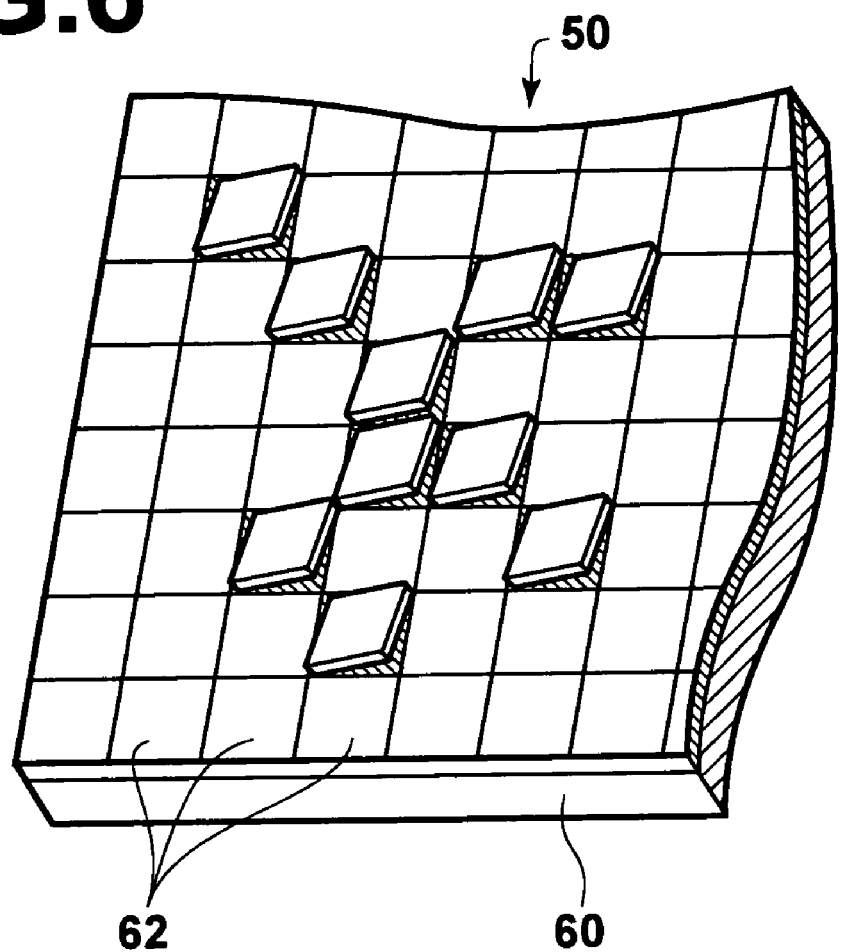
FIG. 6 is a fragmentary enlarged view of a digital micro mirror device (DMD)

In this particular embodiment, a prism pair 73 is disposed between the second imaging optical system and the photosensitive material 150. By moving up and down the prism pair 73 in FIG. 5, the image can be brought into focus on the photosensitive material 150. The photosensitive material 150 is fed in the direction of arrow F in FIG. 5 (sub-scanning). As shown in FIG. 6, the DMD 50 is a mirror device comprises an SRAM cell (memory cell) 60 and a number of (e.g., 1024×768) micro mirrors 62 which form pixels and are arranged on the SRAM cell 60 in a pattern of lattice. In each of the pixels, a micro mirror 62 disposed in the uppermost position is supported by a post. The surface of each micro mirror 62 is coated by deposition with material such as aluminum which is high in reflectance. The reflectance of the micro mirrors 62 is not lower than 90%, and the micro mirrors 62 are arranged at pitches of, for instance, 13.7 μm in both the longitudinal and transverse directions. The SRAM cell 60 just below the micro mirrors 62 is of CMOS of a silicon gate which is made by a production line of usual semiconductor memories and is provided with the posts including hinges and yokes. The DMD 50 is monolithic in total.

Figure 7A:
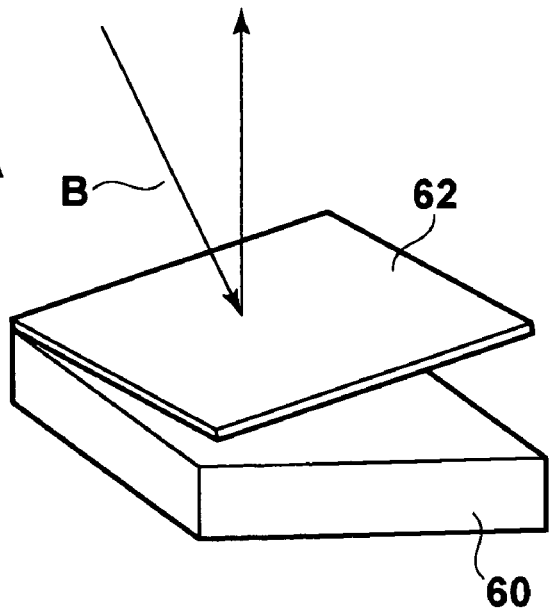
FIGS. 7A and 7B are views for illustrating action of the DMD.
Figure 7B:
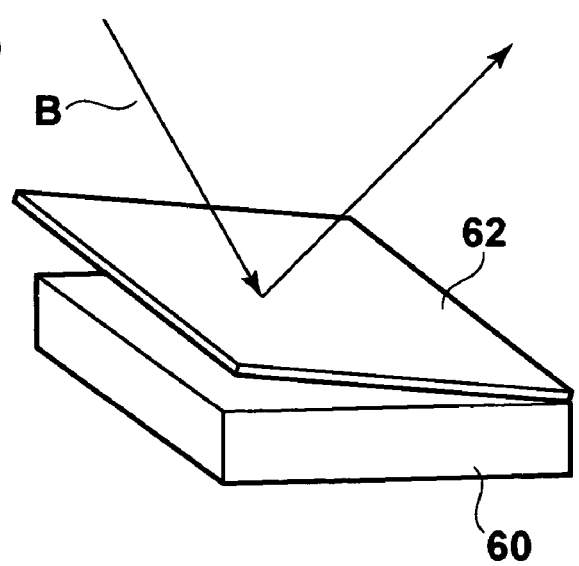

When a digital signal is written in the SRAM cell 60 in the DMD 50, the micro mirror 62 supported by the post is inclined about a diagonal line within ±α° (e.g., ±12°) with respect to the substrate of the DMD 50. FIG. 7A shows a state where the micro mirror 62 is turned on and inclined by +α° and FIG. 7B shows a state where the micro mirror 62 is turned off and inclined by −α°. By controlling the inclination of the micro mirrors 62 of the DMD 50 as shown in FIG. 6 according to the image signal, the laser beam B impinging upon the DMD 50 is reflected in the direction governed by the inclination of the micro mirrors 62.

FIG. 6 shows a part of the DMD 50 in an enlarged scale and shows an example of the state where the micro mirrors 62 are controlled to +α° or −α°. The respective micro mirrors 62 are turned on and off under the control of the above mentioned controller 302 connected to the DMD 50. A light absorber (not shown) is disposed in the optical path of light reflected by the micro mirror 62 which is in the off state.

Further, it is preferred the DMD 50 be slightly inclined so that its shorter side is at a predetermined angle θ (e.g., 0.1 to 5°) to the sub-scanning direction. FIG. 8A shows the scanning locus of the image of light (exposure beam) 53 reflected by each micro mirror 55a when the DMD 50 is not inclined, whereas FIG. 8B shows the scanning locus of the exposure beam 53 when the DMD 50 is inclined.

The DMD 50 comprises a number of (e.g., 756) micro mirror rows, each formed of a number of (e.g., 1024) micro mirrors arranged in the longitudinal direction, arranged in the transverse direction. When the DMD 50 is inclined as shown in FIG. 8B, the pitches P2 of the scanning loci of the exposure beams 53 reflected by the micro mirrors (the scanning lines) becomes narrower than those P1 when the DMD 50 is not inclined as shown in FIG. 8A, whereby the resolution can be greatly improved. Since the angle of inclination of the DMD 50 is very small, the scanning width $W_2$ when the DMD 50 is inclined is substantially the same as that $W_1$ when the DMD 50 is not inclined.

Further, since the same scanning line is exposed multiple times by different micro mirror rows (multiple exposure), a slight shift of the exposure position with respect to the alignment mark can be controlled, whereby high definition exposure can be realized. Further, the connections between adjacent exposure heads arranged in the main scanning direction can be smoothly connected by exposure position control by a very small amount.

The same effect can be obtained by staggering the micro mirror rows in a direction perpendicular to the sub-scanning line in place of inclining the DMD 50.

Figure 9A:
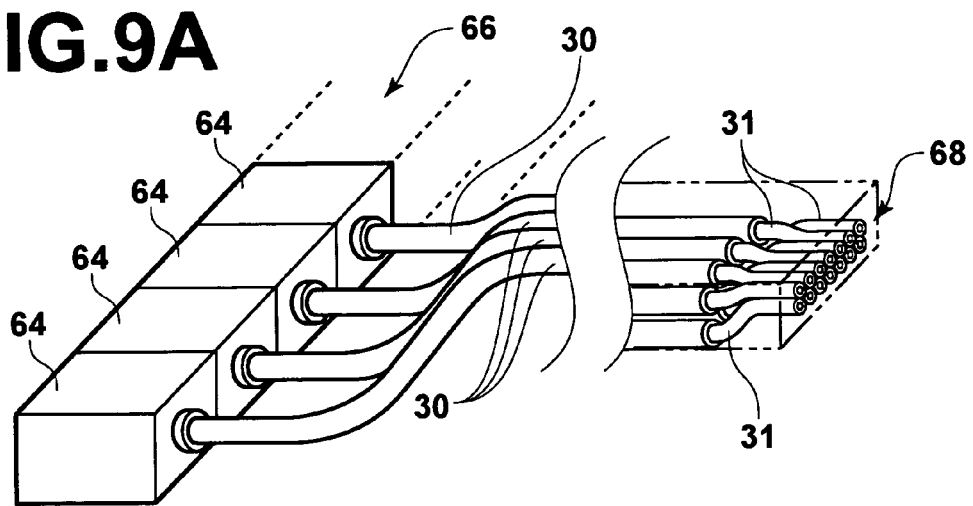
FIG. 9A is a perspective view showing the arrangement of the fiber array light source.
Figure 9B:
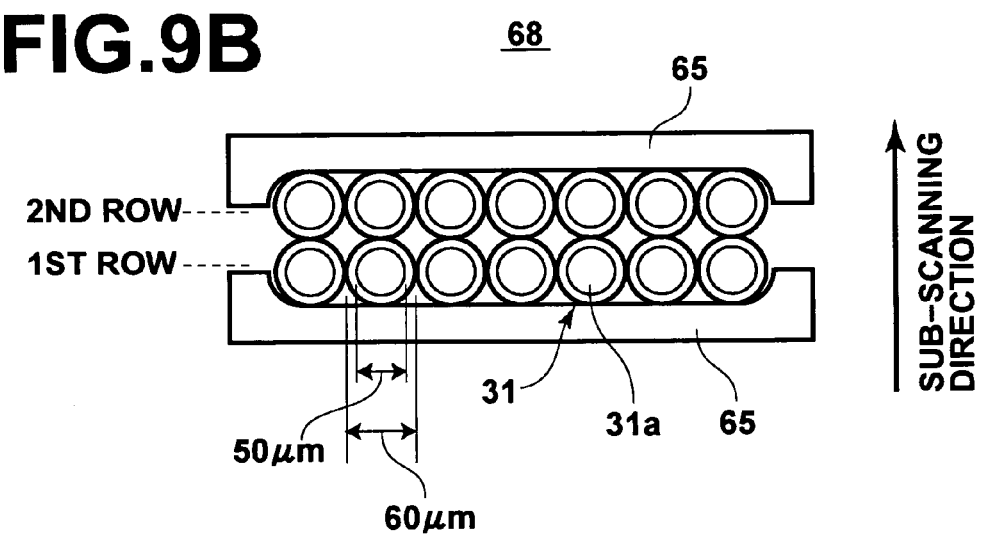
FIG. 9B is a front elevation showing the arrangement of the light emitting points in the laser exit face of the fiber array light source.

The fiber array light source 66 is provided with a plurality of (e.g., 14) laser modules 64 and a multi-mode optical fiber 30 is connected to each of the laser modules 64 at one end thereof as shown in FIG. 9A. An optical fiber 31 which is equal to the multi-mode optical fiber 30 in core diameter and is smaller than the multi-mode optical fiber 30 in clad diameter is coupled to the other end of the multi-mode optical fiber 30. As shown in detail in FIG. 9B, the end portions opposite to the optical fibers 30 of the seven optical fibers 31 are arranged in the main scanning direction perpendicular to the sub-scanning direction to form a laser beam emitting half, and two laser beam emitting halves are arranged side by side to form a laser beam emitting portion 68.

The laser beam emitting portion 68 formed by the end portions of the multi-mode optical fibers 31 is sandwiched and fixed by a pair of support plates 65 having flat surfaces. It is preferred that the light exit end face of the multi-mode optical fiber 31 be provided with a transparent protective plate such as of glass for the protection thereof. The light exit end face of the multi-mode optical fiber 31 is apt to collect dust and to thereby deteriorate due to a high light density. However, by providing the protective plate described above, dust can be prevented from adhering to the end face and deterioration of the end face can be slowed.

Figure 10:
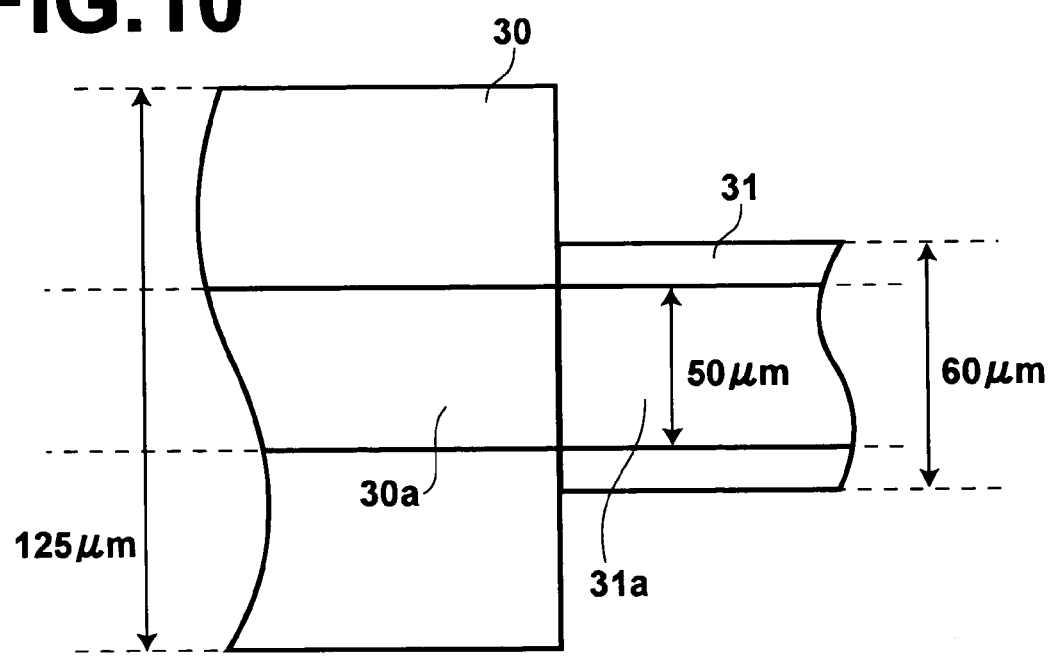
FIG. 10 is a view showing the arrangement of the multi-mode optical fiber.

As shown in FIG. 10, in this particular embodiment, the optical fiber 31 which is 1 to 30 cm in length and smaller in core diameter is coaxially coupled to the leading end portion of the multi-mode optical fiber 30 which is larger in core diameter. The optical fibers 30 and 31 are coupled by fusing the light inlet end face of the optical fiber 31 to the light exit end face of the optical fiber 30 with the core axes of the fibers 30 and 31 aligned with each other. As described above, the diameter of the core 31a of the optical fiber 31 is equal to the diameter of the core 30a of the optical fiber 30.

As the multi-mode optical fiber 30 and the optical fiber 31, any of a step index optical fiber, a graded index optical fiber and a composite optical fiber may be employed. For example, a step index optical fiber available from MITSUBISHI CABLE INDUSTRIES LTD. can be employed. In this particular embodiment, the multi-mode optical fiber 30 and the optical fiber 31 are step index optical fibers, and the former optical fiber is 125 μm in clad diameter, 50 μm in core diameter, 0.2 in NA, and not lower than 99.5% in transmissivity of the coating on the light incident end face, while the latter optical fiber is 60 μm in clad diameter, 50 μm in core diameter, and 0.2 in NA.

The clad diameter of the optical fiber 31 need not be limited to 60 μm. Many of the optical fibers employed in the conventional fiber light sources are 125 μm in clad diameter. However, since as the clad diameter is reduced, the focal depth increases, the clad diameter of the multi-mode optical fiber is preferably not larger than 80 μm and more preferably not larger than 60 μm. Whereas the single-mode optical fiber should be at least 3 to 4 μm in core diameter. Accordingly, the clad diameter of the optical fiber 31 is preferably not smaller than 10 μm. Further, it is preferred from the view point of the coupling efficiency that the core diameters of the optical fibers 30 and 31 be equal to each other.

Figure 11:
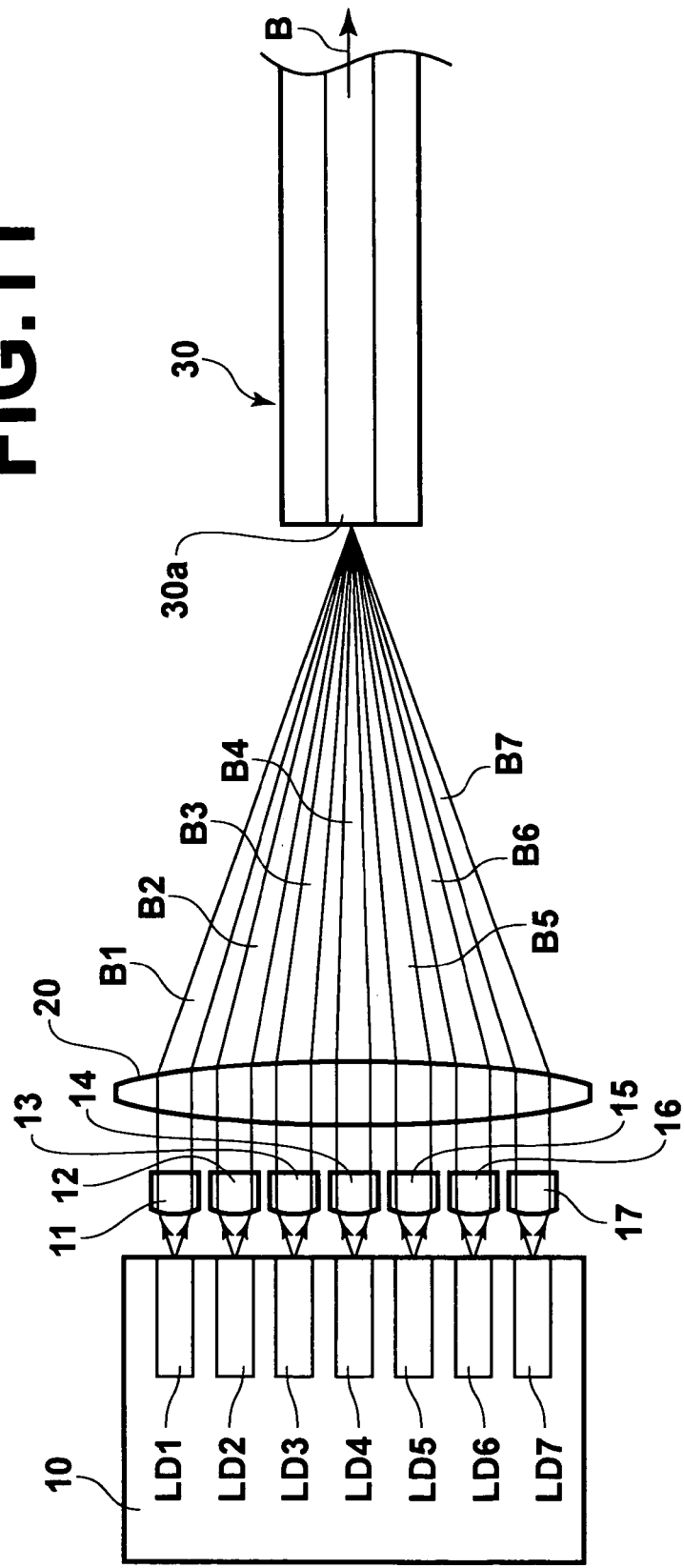
FIG. 11 is a plan view showing the arrangement of the wave combined laser.

The laser module 64 is formed by a wave combined laser (a fiber optical source) shown in FIG. 11. The wavelength combined laser comprises a plurality of (e.g., 7) GaN semi-conductor laser chips LD1, LD2, LD3, LD4, LD5, LD6, and LD7 which are of a transverse multi-mode or a single mode and are arranged and fixed on a heat block 10, collimator lenses 11, 12, 13, 14, 15, 16 and 17 provided corresponding to each of the GaN semi-conductor lasers LD1 to LD7, a collective lens 20 and a multi-mode optical fiber 30. The number of the semi-conductor laser need not be limited to seven but may be other numbers. A collimator lens array where collimator lenses are integrated may be employed in place of the 7 collimator lenses 11 to 17.

All the GaN semi-conductor lasers LD1 to LD7 are the same in oscillation wavelength (e.g., 405 nm) and in maximum output power (e.g., about 100 mW in multi-mode lasers and about 50 mW in single mode lasers). The GaN semi-conductor lasers LD1 to LD7 may oscillate at a wavelength other than 405 nm in the range of 350 nm to 450 nm.

Figure 12:
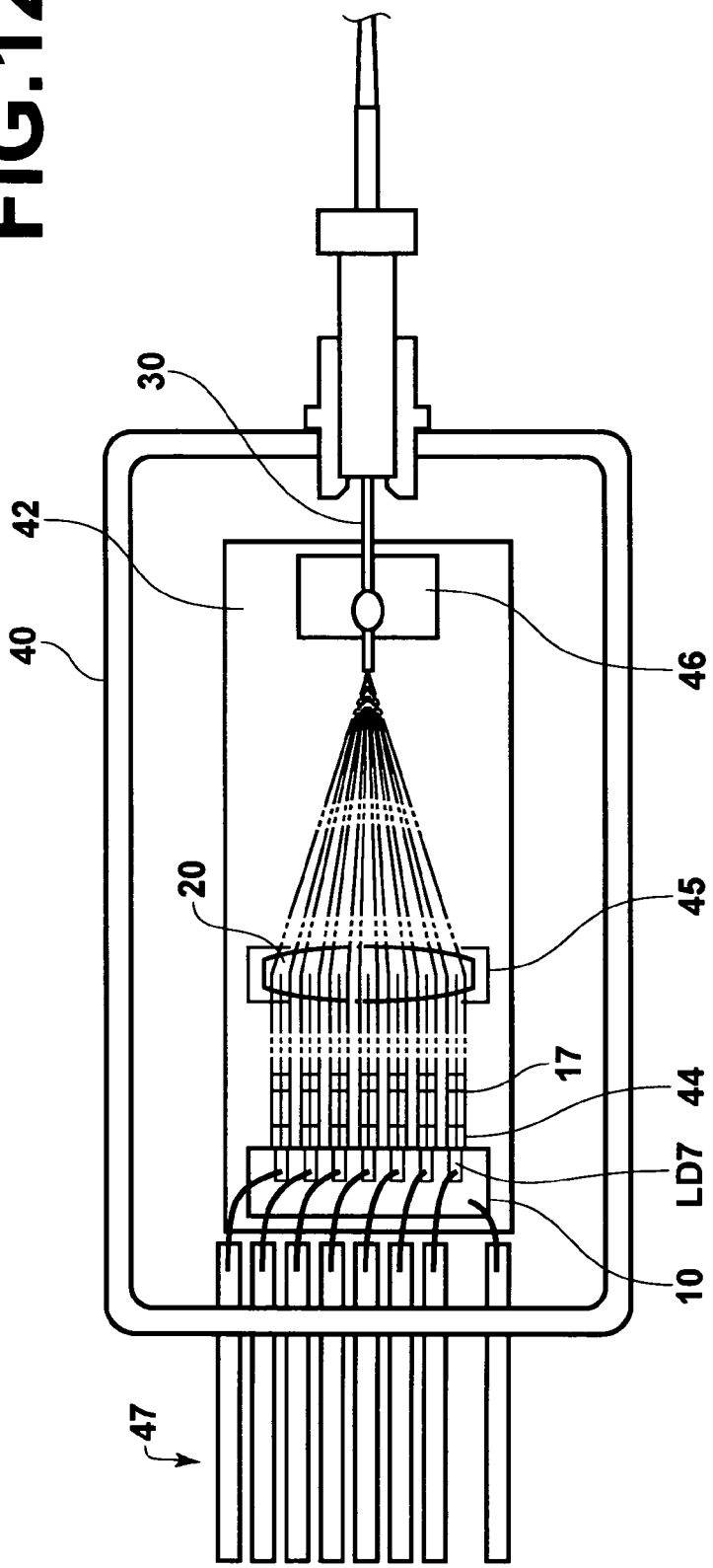
FIG. 12 is a plan view showing the arrangement of the laser module.
Figure 13:
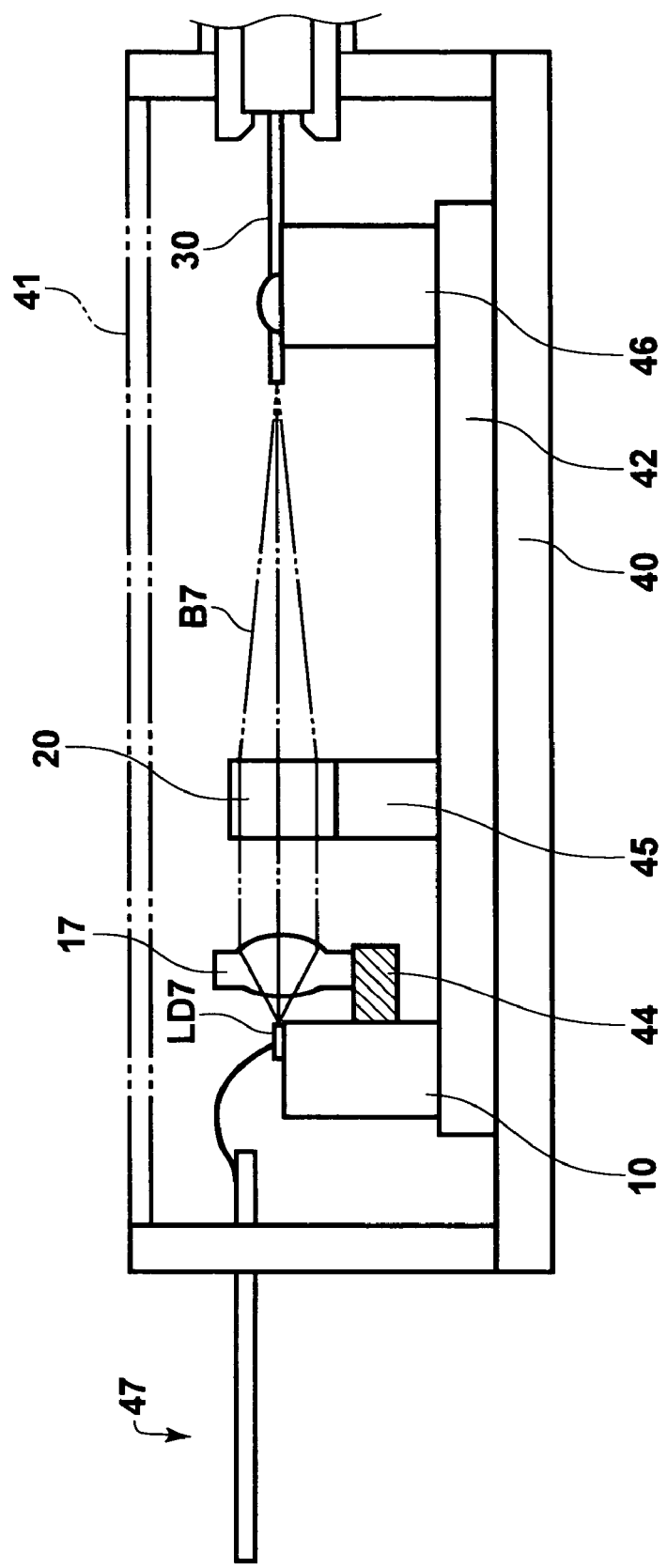
FIG. 13 is a side view showing the arrangement of the laser module shown in FIG. 12.

As shown in FIGS. 12 and 13, the wave combined laser is accommodated together with other optical elements in box-like package 40 open at the upper side. The package 40 is provided with a lid 41 which closes the opening of the package 40 and by closing the opening of the package 40 by the lid 41 after deaeration and introduction of sealing gas, the wave combined laser is air-tightly sealed inside the package 40 (the closed space).

A base plate 42 is fixed to the bottom surface of the package 40 and the heat block 10, a lens holder 45 which holds the collective lens 20 and a fiber holder 46 which holds the light inlet end portion of the multi-mode optical fiber 30 are mounted on the upper surface of the base plate 42. The light exit end portion of the multi-mode optical fiber 30 is drawn outside the package 40 through an opening formed in the wall of the package 40.

A collimator lens holder 44 is mounted on a side surface of the heat block 10 and the collimator lenses 11 to 17 are held by the collimator lens holder 44. An opening is formed in a side wall of the package 40 and wires for supplying a drive current to the GaN semi-conductor lasers LD1 to LD7 are drawn outside the package 40 through the opening.

In FIG. 13, only the GaN semi-conductor laser LD7 is numbered and only the collimator lens 17 is numbered in order to avoid complication of the drawing.

Figure 14:
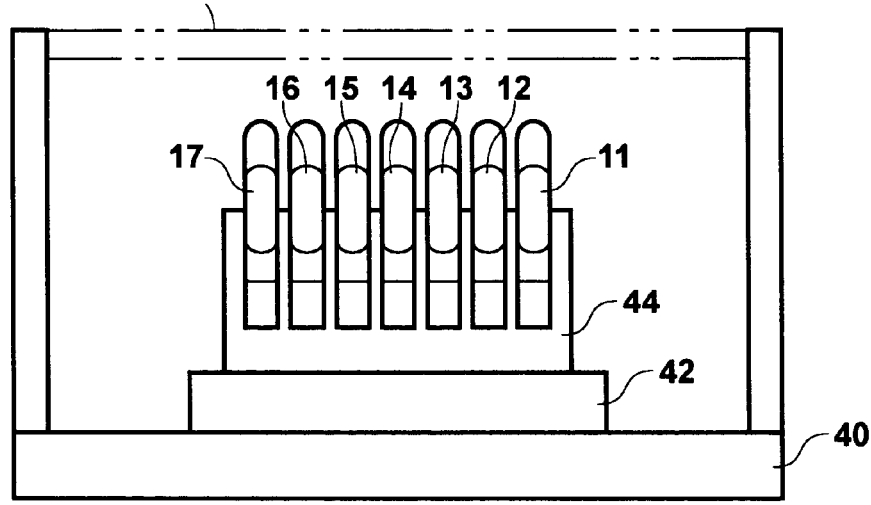
FIG. 14 is a fragmentary front elevation showing the arrangement of the laser module shown in FIG. 12.

FIG. 14 is front view showing the mounting portion of the collimator lenses 11 to 17. As shown in FIG. 14, each of the collimator lenses 11 to 17 is of a shape obtained by slenderly cutting from a circular lens with an aspherical surface along parallel planes a portion including the optical axis. The slender collimator lens can be formed, for instance, by molding of resin or optical glass. The collimator lenses 11 to 17 are arranged close to the light emitting points of the GaN semi-conductor lasers LD1 to LD7 so that their longitudinal direction is perpendicular to the direction in which the light emitting points of the GaN semi-conductor lasers LD1 to LD7 are arranged (the direction from side to side in FIG. 14).

Each of the GaN semi-conductor lasers LD1 to LD7 is provided with an active layer whose light emission width is 2 μm and the GaN semi-conductor lasers LD1 to LD7 respectively emit laser beams B1 to B7 with the divergent angles in directions parallel and perpendicular to the active layer being 10° and 30°, respectively. The GaN semi-conductor lasers LD1 to LD7 are arranged so that their light emitting points are arranged in a row in a direction parallel to the active layer.

Accordingly, the laser beams B1 to B7 emitted from the light emitting points impinge upon the slender collimator lenses 11 to 17 with the direction of the larger divergent angles conforming to the longitudinal directions of the collimator lenses 11 to 17 and the direction of the smaller divergent angles conforming to the transverse directions (a direction perpendicular to the longitudinal direction) of the collimator lenses 11 to 17. Each of the collimator lenses 11 to 17 is 1.1 mm in width and 4.6 mm in length, and the beam diameter of each of the laser beams B1 to B7 impinging upon the collimator lenses 11 to 17 in the horizontal direction and that in the vertical direction are 0.9 mm and 2.6 mm, respectively. Further, each of the collimator lenses 11 to 17 is 3 mm in focal length ($f_1=3$ mm) and 0.6 in numerical aperture (NA=0.6), and the collimator lenses 11 to 17 are arranged at pitches of 1.25 mm.

The collective lens 20 is of a shape obtained by slenderly cutting from a circular lens with an aspherical surface along parallel planes a portion including the optical axis and is long in the direction of arrangement of the collimator lenses 11 to 17 (i.e., in the horizontal direction) and is short in a direction perpendicular to the direction of arrangement of the collimator lenses 11 to 17. The collective lens 20 is 23 mm in focal length ($f_2=23$ mm) and 0.2 in numerical aperture (NA=0.2). Also this collective lens 20 can be formed, for instance, by molding of resin or optical glass.

Figure 15:
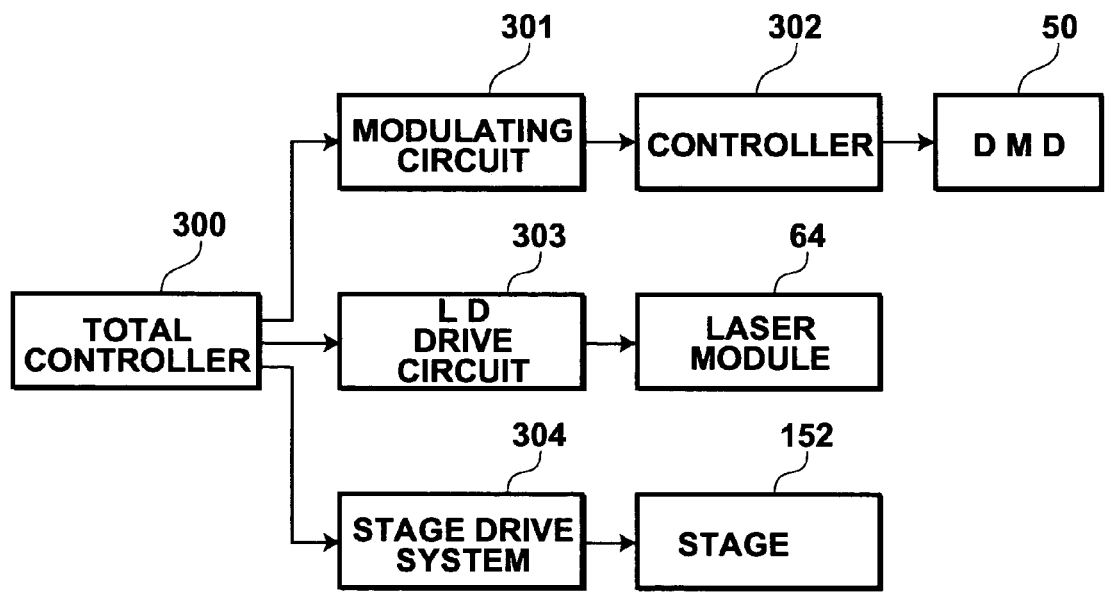
FIG. 15 is a block diagram showing the electrical arrangement of the image exposure system.

The electrical arrangement of the image exposure system of this embodiment will be described with reference to FIG. 15, hereinbelow. As shown in FIG. 15, a modulating circuit 301 is connected to a total controller 300, and a controller 302 which controls the DMD 50 is connected to the modulating circuit 301. Further, an LD drive circuit 303 which drives the laser module 64 is connected to the total controller 300, and a stage drive system 304 which drives the movable stage 152 is connected to the total controller 300.

[Operation of the Image Exposure System]

Operation of the image exposure system described above will be described, hereinbelow. Each of the laser beams B1, B2, B3, B4, B5, B6 and B7 emitted in the state of divergent light from the corresponding one of the GaN semi-conductor lasers LD1 to LD7 (FIG. 11) which forms the wave combined laser of the fiber array light source 66 in each of the exposure heads 166 of the scanner 162 is converted to a parallel light beam by the corresponding one of the collimator lenses 11 to 17. The collimated laser beams B1 to B7 are collected by the collective lens 20 and converged on the light inlet end face of the core 30a of the multi-mode optical fiber 30.

In this embodiment, the collimator lenses 11 to 17 and the collective lens 20 form a collective optical system and the collective optical system and the multi-mode optical fiber 30 form a wave combined optical system. That is, the laser beams B1 to B7 collected by the collective lens 20 as described above enter the multi-mode optical fiber 30 and propagates through the optical fiber 30 combined into a single laser beam B. Then the single laser beam B is radiated from the optical fiber 31 coupled to the light exit face of the multi-mode optical fiber 30.

Assuming that the coupling efficiency of the laser beams B1 to B7 to the multi-mode optical fiber 30 is 0.9 and the output of each of the GaN semi-conductor lasers LD1 to LD7 is 50 mW, a wave combined laser beam B at an output of 315 mW (=50 mW×0.9×7) can be obtained for each of the optical fibers 31 arranged in an array. Accordingly, a laser beam B at an output of 4.4 W (=0.315 W×14) can be obtained for the 14 multi-mode optical fibers 31 in total.

Image data according to the exposure pattern is input into the controller 302 for the DMD 50 from the modulating circuit 301 (FIG. 15) and once stored in a frame memory. The image data represents the density of each of the pixels forming the image in the binary code (whether or not the dot is recorded).

The movable stage 152 attracting the photosensitive material 150 against its surface is conveyed by the stage drive unit 304 at a constant speed along the guides 158 from the upstream side to the downstream side of the gate 160. When the movable stage 152 passes below the gate 160, the leading end of the photosensitive material 150 is detected by the sensors 164 mounted on the gate 160, and when the leading end of the photosensitive material 150 is detected by the sensors 164, the image data stored in the frame memory is read out lines to lines and the control signals are generated by the data processing portion for the exposure heads 166 on the basis of the image data read out. Then the mirror drive portion turns on and off the micro mirrors of the DMD 50 of the corresponding exposure heads 166 on the basis of the generated control signals. In this particular embodiment, the size of the micro mirror forming one pixel is 14 μm×14 μm.

When the laser beam B is projected onto the DMD 50 from fiber array light source 66, the laser beam B reflected by the micro mirrors in the on state is imaged on the photosensitive material 150 through the lens systems 54 and 58. The laser beam emitted from the fiber array light source 66 is turned on and off by the pixels in this manner and the photosensitive material 150 is exposed to light pixel by pixel (exposure area 168) the number of which is substantially the same as the number of the pixels in the DMD 50. Further, since the photosensitive material 150 is conveyed at a constant speed together with the movable stage 152, the photosensitive material 150 is sub-scanned by the scanner 162 in the direction opposite to the direction of movement 162 of the movable stage 162 and a strip-like exposed area 170 is formed for each exposure head 166.

Figure 16A:
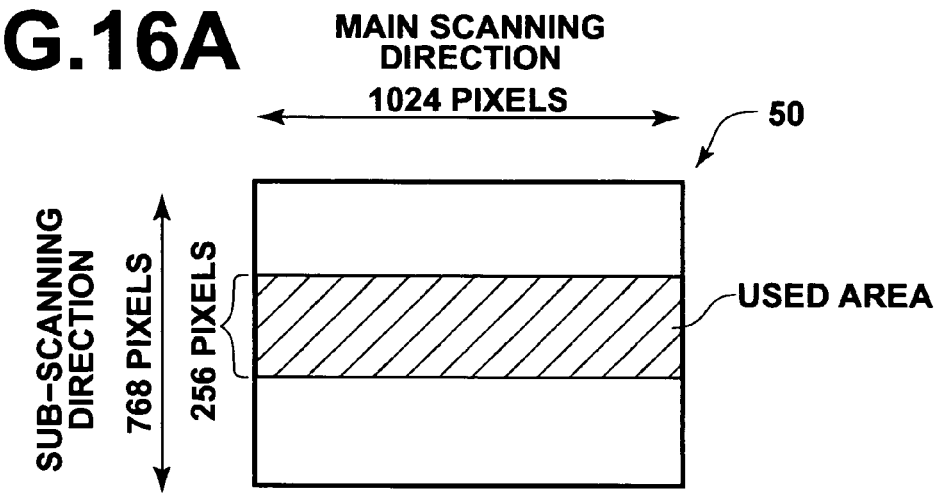
FIGS. 16A and 16B are views for illustrating examples of the used area of the DMD.
Figure 16B:
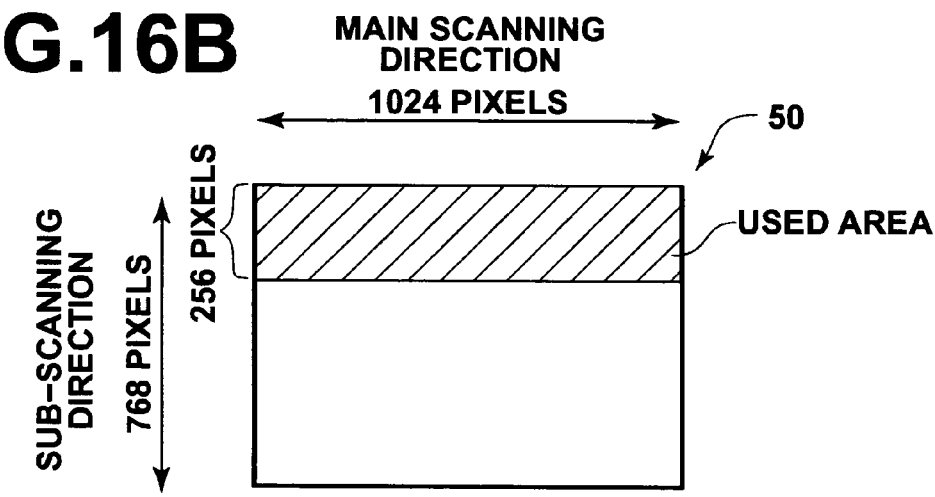

Though the DMD 50 in this particular example has 768 micro mirror rows (each comprising 1024 micro mirrors arranged in the main scanning direction) arranged in the sub-scanning direction as shown in FIGS. 16A and 16B, only a part of the micro mirror rows (e.g., 1024×256) are driven by the controller 302 in this particular embodiment.

In this case, only the micro mirror rows disposed at a central portion of the DMD 50 as shown in FIG. 16A may be employed or only the micro mirror rows disposed in one edge portion of the DMD 50 as shown in FIG. 16B may be employed. Otherwise, the micro mirror rows employed may be selected on the basis of the situation. For example, when defect is found in a part of the micro mirrors, only the micro mirror rows free from the defect may be employed.

Since the data processing speed of the DMD 50 is limited and the modulating speed per one line is governed in proportion to the number of pixels employed, the modulating speed per one line can be increased by employing only a part of the micro mirror rows. On the other hand, when an exposure system where the exposure heads are continuously moved with respect to the exposed surface is employed, all the pixels arranged in the sub-scanning direction need not be used.

When the sub-scanning of the photosensitive material 150 by the scanner 162 is completed and the trailing end of the photosensitive material is detected by the sensors 164, the stage 152 is returned along the guides 158 to its original position at the upstream position of the gate 160 by the stage drive unit 304 and then moved again at a constant speed along the guides 158 from the upstream side to the downstream side of the gate 160.

An illuminator optical system comprising the fiber array light source 66, the collective lens 71, the rod integrator 72, the imaging lens 74, the mirror 69 and the TIR prism 70 (FIG. 5) for projecting the laser beam B onto the DMD 50 as illuminative light will be described, hereinbelow. The rod integrator 72 is a light-transmitting rod shaped, for instance, into a rectangle and as the laser beam B propagates through the rod integrator 72 repeating total internal reflection, the intensity distribution in a beam cross-section of the laser beam B is uniformed. An antireflection coating is provided on the light inlet end face and the light exit end face of the rod integrator 72 to increase the transmissivity of the light inlet end face and the light exit end face of the rod integrator 72. When the intensity distribution in a beam cross-section of the laser beam B is highly uniformed in this manner, the illuminative light can be uniformed and the photosensitive material 150 can be exposed to a high-definition image.

Figure 17:
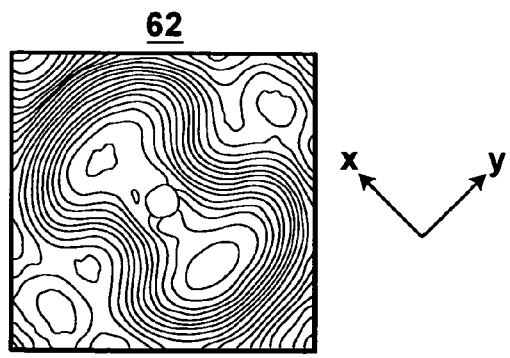
FIG. 17 is a view showing the distortion of the reflecting surface of the micro mirror forming the DMD.
Figure 18A:
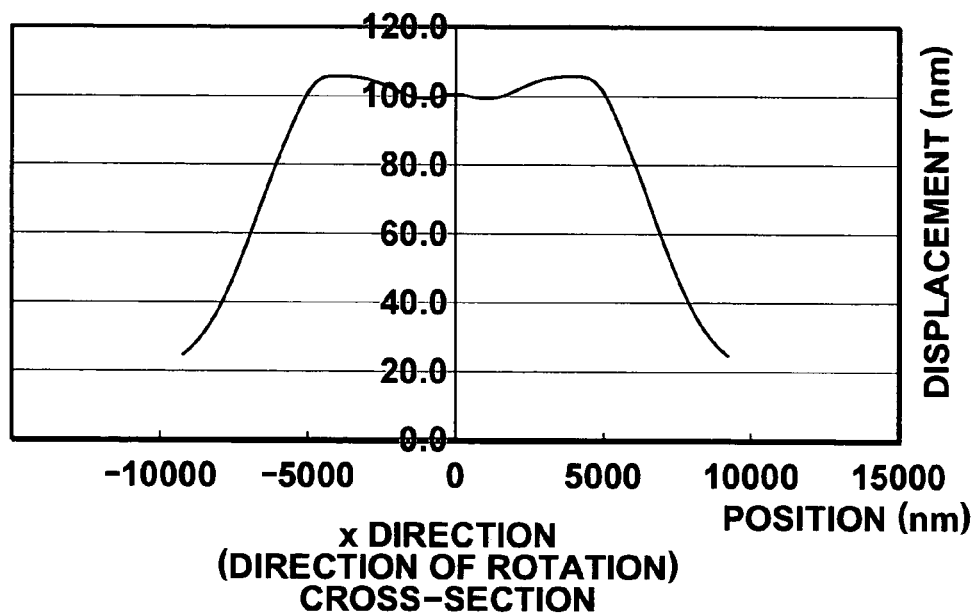
FIGS. 18A and 18B are views respectively showing the distortion of the reflecting surface of the micro mirror along the two diagonal lines of the micro mirror.
Figure 18B:
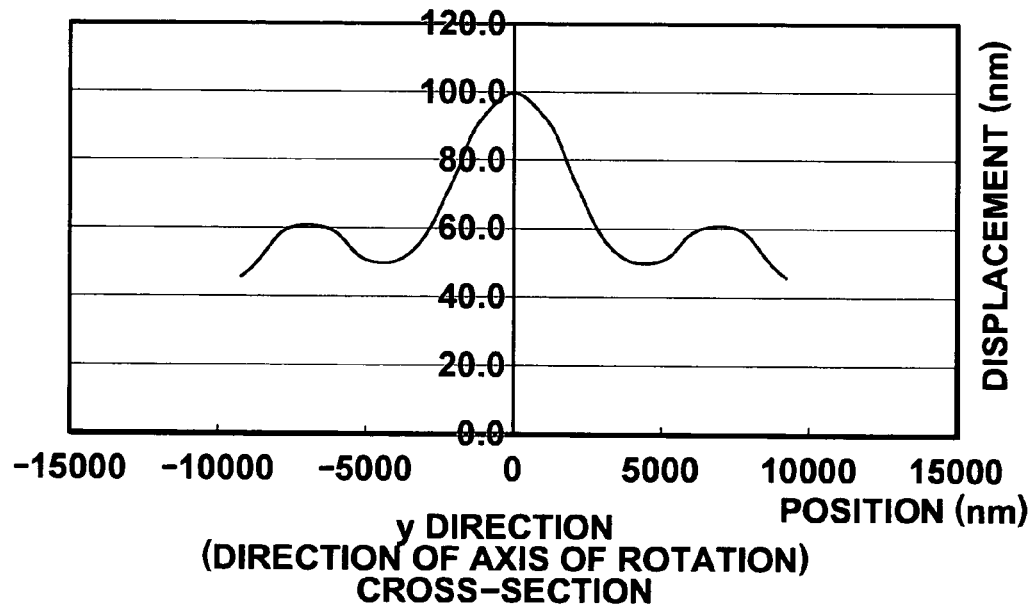

FIG. 17 shows the result of measurement of flatness of the reflecting surface of the micro mirror of the DMD 50. In FIG. 17, the positions on the reflecting surface at the same level are joined by contour lines at pitches of 5 nm. The directions of arrows x and y are directions of diagonal lines of the micro mirror 62 and the micro mirror 62 rotates about the axis of rotation extending in the direction of arrow y. FIG. 18A shows change in the level of the reflecting surface of the micro mirror 62 along the direction of arrow x, while FIG. 18B shows change in the level of the reflecting surface of the micro mirror 62 along the direction of arrow y.

As shown in FIGS. 17 and 18 (18A and 18B), the reflecting surface of the micro mirror 62 has a distortion.

Especially, the distortion is larger in the direction of one diagonal line (the direction of arrow y) than the direction of the other diagonal line (the direction of arrow x) in a central portion of the micro mirror 62. Accordingly, there can be caused to a problem that the shape of the laser beam B collected by the micro lenses 55*a* of the micro lens array 55 is distorted in the light collecting position.

In the image exposure system of this embodiment, the micro lens 55*a* of the micro lens array 55 is of a special shape different from that of the conventional image exposure system. This will be described in detail, hereinbelow.

Figure 19A:
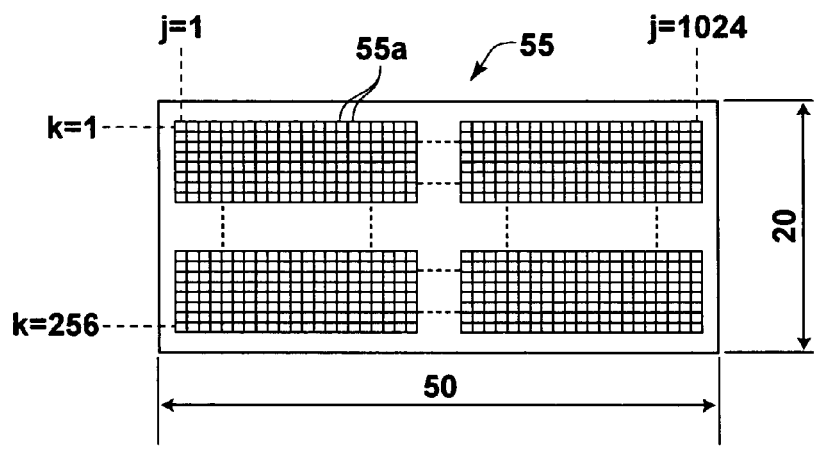
FIGS. 19A and 19B are a front elevation and a side view of the micro lens array employed in the image exposure system.
Figure 19B:
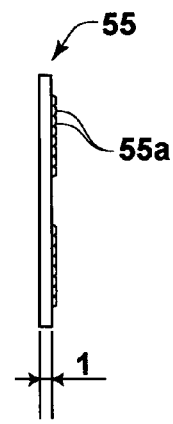

FIGS. 19A and 19B respectively show in detail a front and a side of the micro lens array 55 with the dimensions of the various parts in mm. In this embodiment, 1024×256 micro mirrors 62 of the DMD 50 are driven as described above in conjunction with FIGS. 16 (16A and 16B), and the micro lens array 55 comprises 256 columns (arranged in the longitudinal direction) of 1024 micro lenses 55*a* arranged in the transverse direction. In FIG. 19A, the order of the micro lens 55*a* in the transverse direction is indicated at j and the order of the micro lens 55*a* in the longitudinal direction is indicated at k.

Figure 20A:
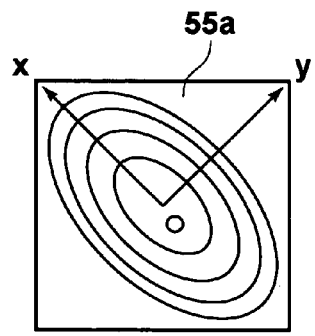
FIGS. 20A and 20B are a front elevation and a side view of the micro lens of the micro lens array.
Figure 20B:

FIGS. 20A and 20B respectively show in a front view and a side view of one micro lens 55*a* of the micro lens array 55. In FIG. 20A, also contour lines of the micro lens 55*a* are shown. The light exit end face of each of the micro lenses 55*a* is aspherical so that the aberration due to the distortion of the micro mirror 62 is corrected. Specifically, each of the micro lenses 55*a* is a toric lens with the radius of curvature Rx optically corresponding to the x direction is −0.125 mm and the radius of curvature Ry optically corresponding to the y direction is −0.1 mm.

Figure 21A:
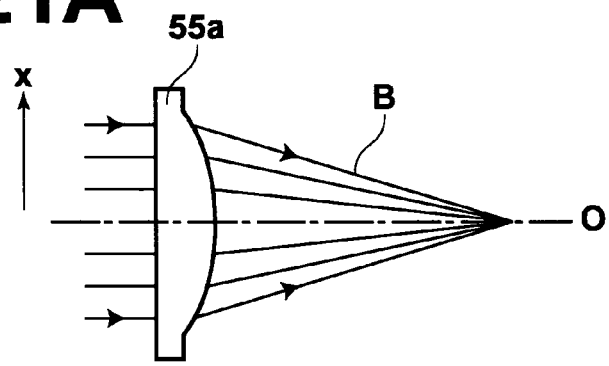
FIGS. 21A and 21B are views respectively showing the states of light collection by the micro lens in one cross-section and in another cross-section.
Figure 21B:
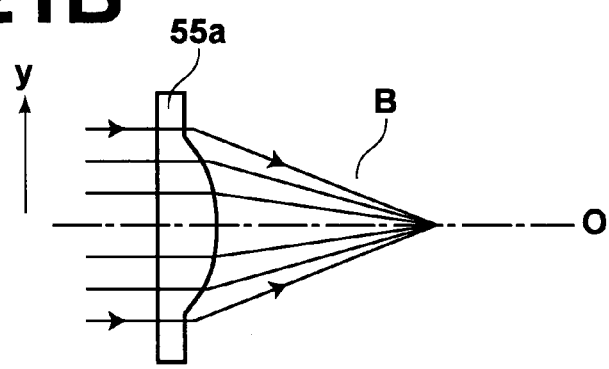
Figure 22A:
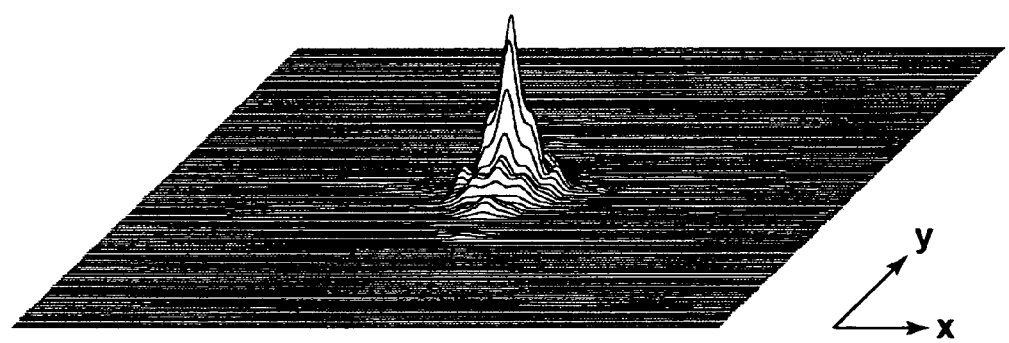
FIG. 22A is a view showing the result of simulation of the beam diameter at a part close to the light collecting point of the micro lens in the image exposure system in accordance with the present invention.
Figure 22B:
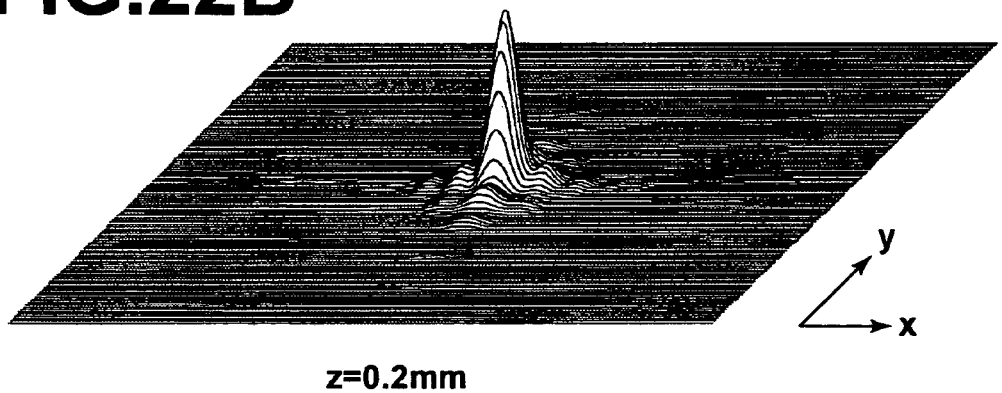
FIG. 22B is a view showing the result of simulation similar to that of FIG. 22A in a different position.
Figure 22C:
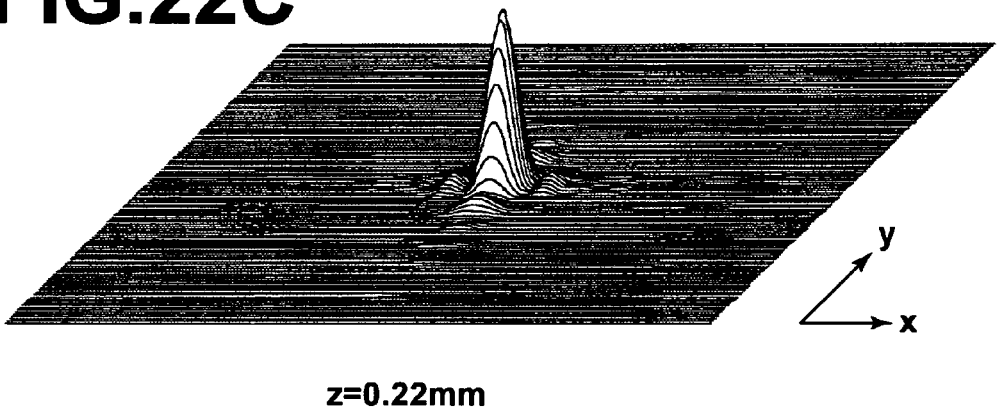
FIG. 22C is a view showing the result of simulation similar to that of FIG. 22A in another different position.
Figure 22D:
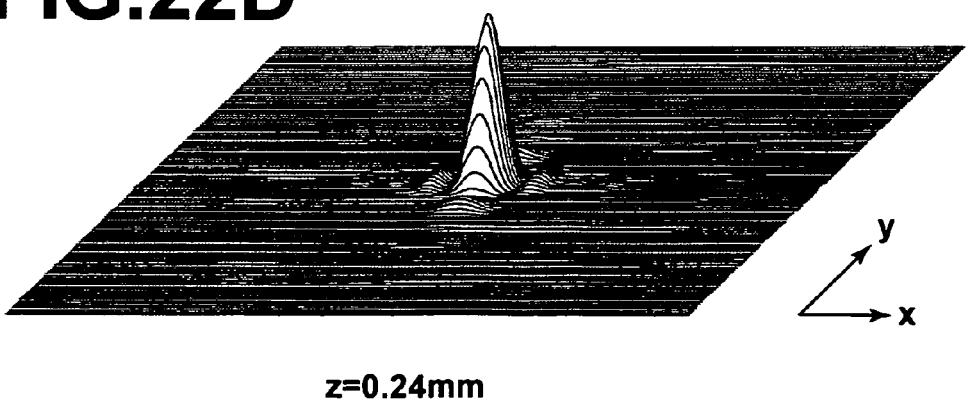
FIG. 22D is a view showing the result of simulation similar to that of FIG. 22A in still another different position.
Figure 23A:
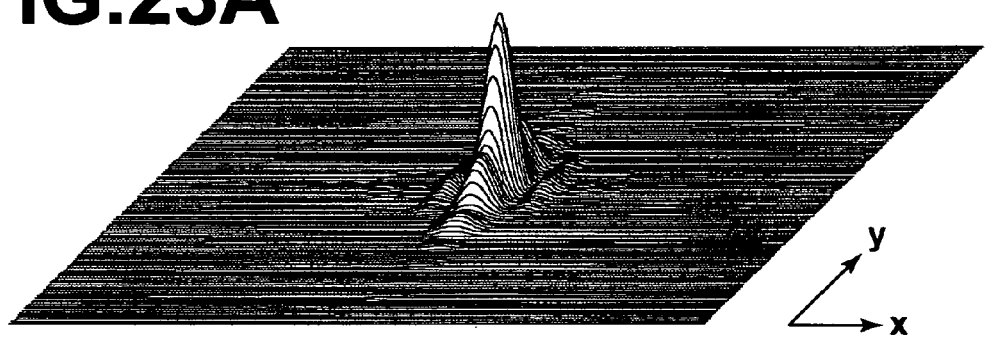
FIG. 23A is a view showing the result of simulation of the beam diameter at a part close to the light collecting point of the micro lens in the conventional image exposure system.
Figure 23B:
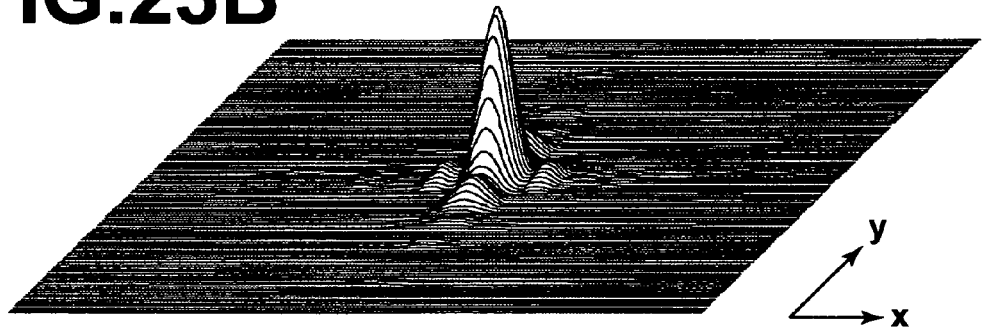
FIG. 23B is a view showing the result of simulation similar to that of FIG. 23A in a different position.
Figure 23C:
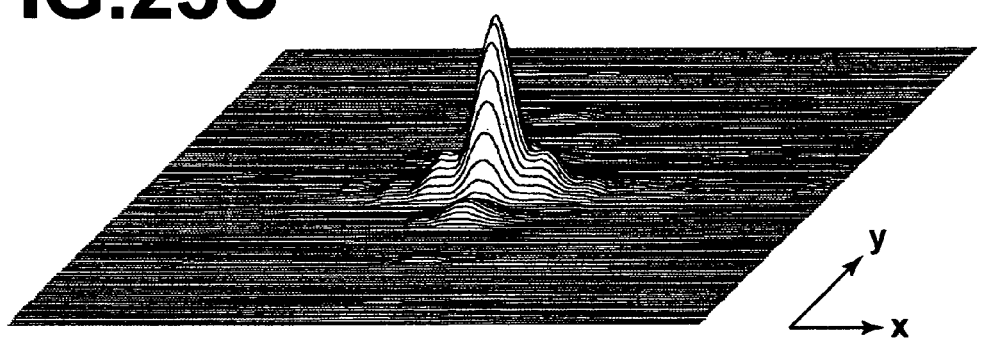
FIG. 23C is a view showing the result of simulation similar to that of FIG. 23A in another different position.
Figure 23D:
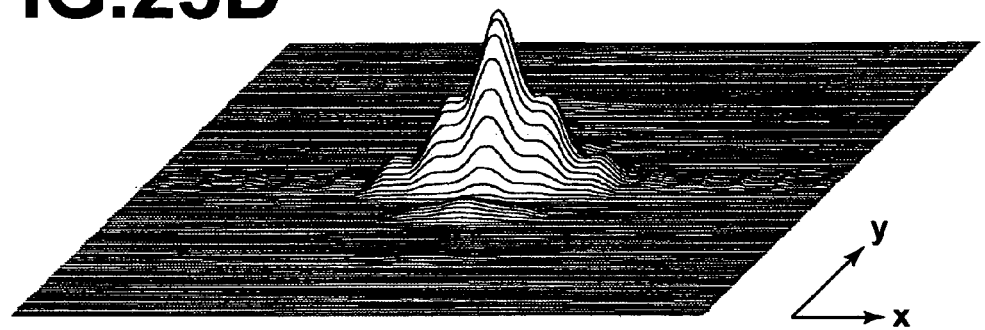
FIG. 23D is a view showing the result of simulation similar to that of FIG. 23A in still another different position.

Accordingly, the states of light collection in cross-sections parallel to the x direction and the y direction are substantially as shown in FIGS. 21A and 21B, respectively. When the cross-sections parallel to the x direction and the y direction are compared with each other, the latter cross-section is smaller in radius of curvature of the micro lens 55*a* than the former cross-section and the focal length is shorter in the latter cross-section than the former cross-section.

The result of simulation of the beam diameters at parts close to the light collecting point (focusing point) of the micro lens 55*a* in the case where the micro lens 55*a* is shaped as described above is as shown in FIGS. 22A to 22D. For the purpose of comparison, the result of the same simulation in the case where the micro lens 55*a* is spherical and is −0.1 mm in both the Rx and Ry (Rx=Ry=−0.1 mm) is shown in FIGS. 23A to 23D. In each of the figures, the value of z represents the position in the direction of focus in which the micro lens 55*a* is evaluated in terms of distance from the beam exit end of the micro lens 55*a*.

The shape of the micro lens 55*a* employed in the above simulation is represented by the following formula, wherein Cx represents the curvature in the x direction (=1/Rx), Cy represents the curvature in the y direction (=1/Ry), X represents the distance from the optical axis O of the lens as measured in the x direction and Y represents the distance from the optical axis O of the lens as measured in the y direction.

$$z = \frac{CxX^2 + CyY^2}{1 + SQRT(1 - Cx^2X^2 - Cy^2Y^2)} \quad (1)$$

As is clear by comparison of FIGS. 22A to 22D and FIGS. 23A to 23D, since the micro lens 55*a* in this embodiment is a toric lens where the focal length in a cross-section parallel to the y direction is smaller than that in a cross-section parallel to the x direction, distortion of the beam shape at parts close to the light collecting point is suppressed and the photosensitive material 150 can be exposed to an image of higher definition and free of distortion. Further, the embodiment of the present invention shown in FIGS. 22A to 22D is smaller in beam diameter, that is, larger in focal depth.

When the distortions of the central portion of the micro mirror 62 in the x direction and the y direction are reverse to the relation described above, by using the micro lens 55*a* which is a toric lens where the focal length in a cross-section parallel to the x direction is smaller than that in a cross-section parallel to the y direction, the photosensitive material 150 can be exposed to an image of higher definition and free of distortion.

The aperture array 59 disposed close to the light collecting position of the micro lens array 55 is disposed so that only light transmitted through the corresponding micro lens 55*a* impinges upon the aperture 59*a*. That is, by providing the aperture array 59, light from adjacent micro lenses 55*a* not corresponding to a given aperture is prevented from entering the aperture and the extinction ratio can be increased. It is preferred that the aperture array 59 is disposed on a focusing position of the micro lens array 55. With this arrangement, light from adjacent micro lenses 55*a* not corresponding to a given aperture 59*a* is more surely prevented from entering the aperture 59*a*.

When the diameter of the apertures 59*a* of such an aperture array 59 provided for the above purpose is small to some extent, distortion of the shape of the beam in the light collecting position of the micro lens 55*a* can be suppressed to some extent. However, this approach is disadvantageous in that the amount of light cut by the aperture array 59 is increased and light utilizing efficiency is reduced. Whereas, in the image exposure system of the present invention where the micro lens 55*a* is of an aspherical surface, basically no light is cut, and accordingly, the light utilizing efficiency can be kept high.

Figure 26A:
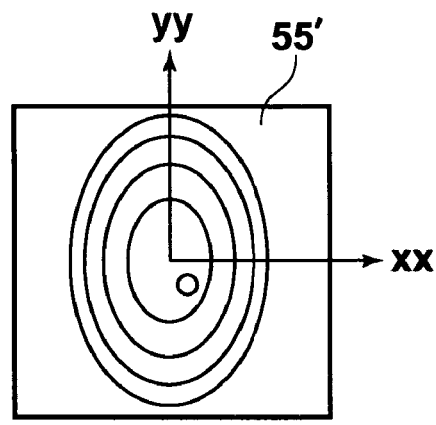
FIGS. 26A and 26B are a front elevation and a side view of the micro lens of the micro lens array of another example.
Figure 26B:

Further, though, in the embodiments described above, the micro lens 55*a* is a toric lens where the curvatures in the x direction and the y direction optically corresponding to the directions of the diagonal lines of the micro mirror 62 differ from each other, a micro lens 55*a*' which is a toric lens where the curvatures in the x direction and the y direction optically corresponding to the directions of two sides of the micro mirror 62 differ from each other as shown in a front elevation with contour lines and a side view in FIGS. 26A and 26B may be employed depending on the distortion of the micro mirror 62.

Though, in this embodiment, the micro lens 55*a* is of a second-order aspherical surface, the beam shape can be improved when the micro lens 55*a* is of a higher-order (fourth-order, sixth-order . . . ) aspherical surface. Further, a lens shape where the curvatures in the x direction and the y direction described above are equal to each other may be employed depending on the distortion of the reflecting surface of the micro mirror 62. Such a lens shape will be described in detail, hereinbelow.

Figure 27A:
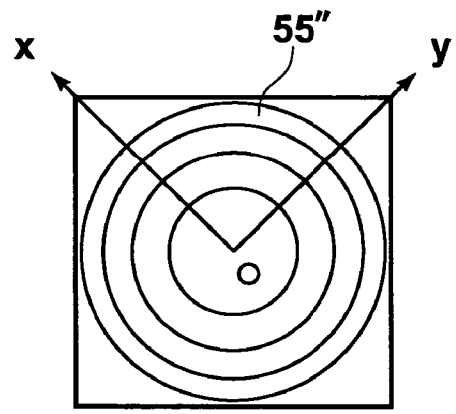
FIGS. 27A and 27B are a front elevation and a side view of the micro lens of the micro lens array of still another example.
Figure 27B:

The micro lens 55*a*" shown in a front elevation with contour lines and a side view in FIGS. 27A and 27B is equal in the curvatures in the x direction and y direction. The curvatures of the micro lens 55*a*" are obtained by correcting the curvature Cy of a spherical lens according to the distance h from the center of the lens. That is, the shape of the spherical lens which is the base of the shape of the micro lens 55*a*" is, for instance, such that the lens height z thereof (the position of the lens face in the direction of the optical axis of the lens) is defined by the following formula (2).

$$z = \frac{Cyh^2}{1 + SQRT(1 - Cy^2h^2)} \quad (2)$$

Figure 28:
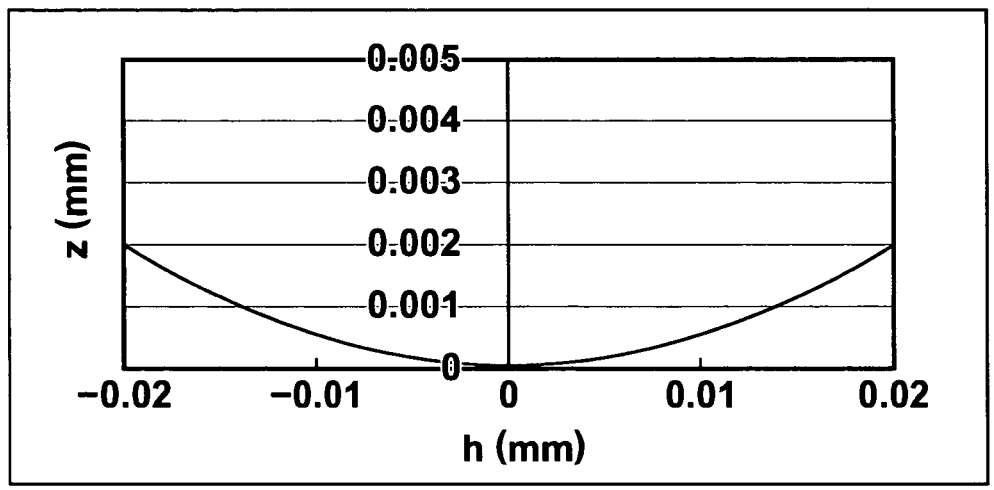
FIG. 28 is a graph showing an example of a shape of a spherical lens.

The relation between the lens height z and the distance h when the curvature Cy described above=1/0.1 mm is plotted in FIG. 28.

Figure 29:
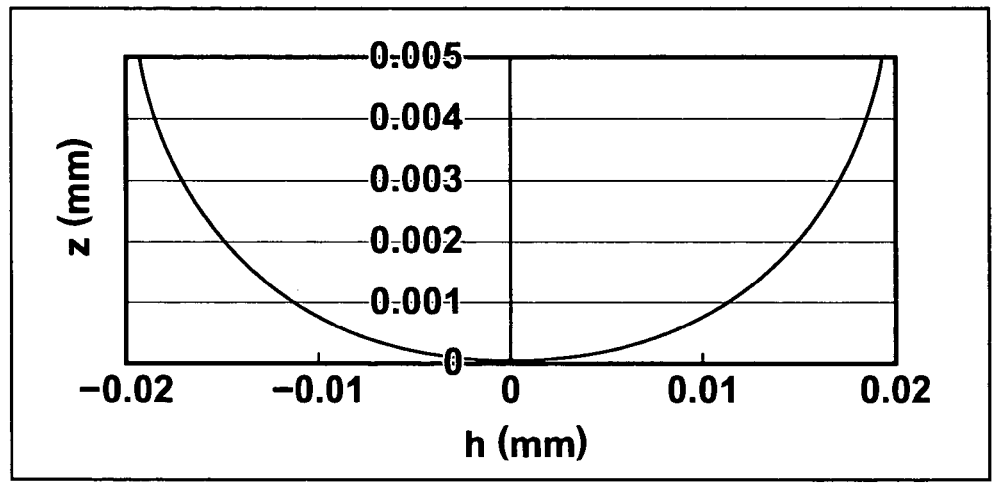
FIG. 29 is a graph showing another example of a shape of lens face of a micro lens which is employed in the present invention.

The curvature Cy of the spherical lens is corrected according to the distance h from the center of the lens as represented by the following formula (3) to obtain the shape of the micro lens 55a".

$$z = \frac{Cyh^2}{1 + SQRT(1 - Cy^2h^2)} + ah^4 + bh^6 \quad (3)$$

z in formula (3) has the same meaning as in formula (2), and in formula (3), the curvature Cy is corrected with fourth order coefficient a and sixth order coefficient b. The relation between the lens height z and the distance h when the curvature Cy, fourth order coefficient a and sixth order coefficient b described above=1/0.1 mm, $1.2 \times 10^3$ and $5.5 \times 10^7$ is plotted in FIG. 29.

Further, though, in the embodiments described above, the end face of the micro lens 55a on the light exit side is of an aspheric surface (toric surface), one of the two light passing end faces of the micro lens 55a may be spherical with the other end face being cylindrical.

Further, though, in the embodiments described above, the micro lens 55a of the micro lens array 55 is of an aspherical surface which corrects aberration due to distortion of the reflecting surface of the micro mirror 62, the micro lens 55a may have a refractive index distribution which corrects aberration due to distortion of the reflecting surface of the micro mirror 62 in place of such an aspherical surface.

Figure 24A:
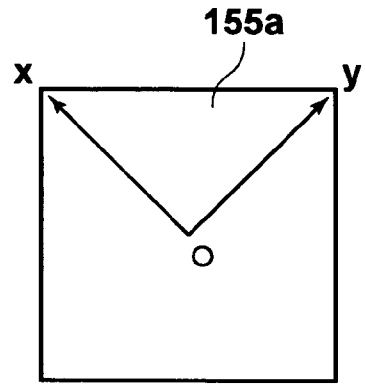
FIGS. 24A and 24B are a front elevation and a side view of the micro lens of the micro lens array employed in another embodiment of the present invention.
Figure 24B:

FIGS. 24A and 24B show an example of such a micro lens 155a. FIG. 24A is a front view of the micro lens 155a and FIG. 24B is a side view of the same. As shown in FIGS. 24A and 24B, the micro lens 155a is a plane-parallel plate in appearance. In FIGS. 24A and 24B, the x direction and the y direction are as described above.

Figure 25A:
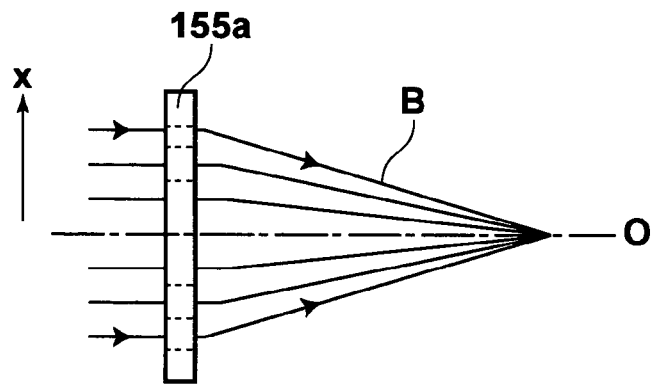
FIGS. 25A and 25B are views respectively showing the states of light collection by the micro lens shown in FIG. 24 in one cross-section and in another cross-section.
Figure 25B:
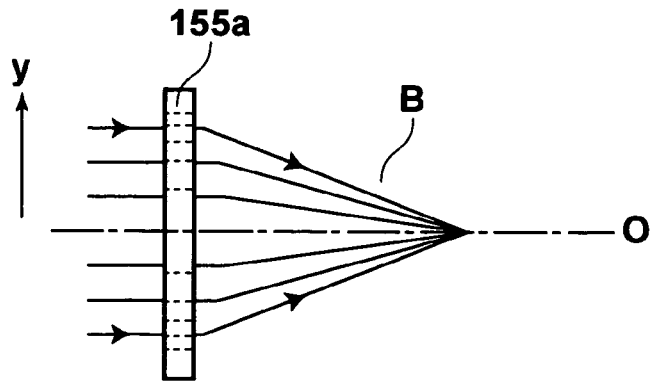

FIGS. 25A and 25B schematically show the states of light collection by the micro lens 155a in cross-sections parallel to the x direction and the y direction, respectively. The micro lens 155a has a refractive index distribution in which the refractive index gradually increases outward from its optical axis O. The broken line shown in the micro lens 155a in FIGS. 25A and 25B represents the positions in which the refractive index of the micro lens 155a changes at constant pitches from the optical axis O. As can be seen from FIGS. 25A and 25B, when the cross-sections parallel to the x direction and the y direction are compared with each other, the proportion of the refractive index change is larger in the latter cross-section than in the former cross-section and the focal length is shorter in the latter cross-section than the former cross-section. Also when a micro lens array comprising a plurality of micro lenses having such a refractive index profile is employed, the same result as when the micro lens array 55 described above is employed can be obtained.

Further, it is possible to provide the refractive index profile described above to the micro lens 55a having an aspherical surface shown in FIGS. 20 (20A and 20B) and 21 (21A and 21B) so that aberration due to distortion of the reflecting surface of the micro mirror 62 is corrected by both the shape of the face and the refractive index profile.

Figure 30:
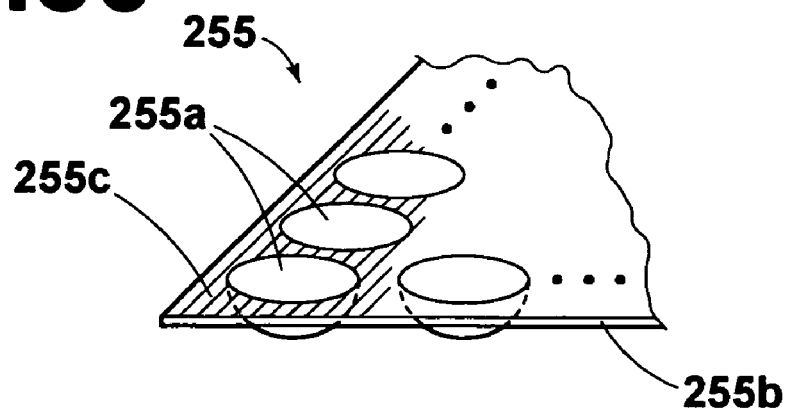
FIG. 30 is a perspective view showing another example of the micro lens array.

An image exposure system in accordance with another embodiment of the present invention will be described, hereinbelow. The image exposure system in accordance with this embodiment of the present invention is basically the same as that previously described with reference to FIGS. 1 to 15 except that the micro lens array 255 shown in FIG. 30 is employed in place of the micro lens array 55 shown in FIG. 5. The micro lens array 255 will be described in detail, hereinbelow.

There is distortion in the reflecting surface of the micro mirror 62 of the DMD 50 as described above with reference to FIGS. 17, 18A and 18B. The rate of change of the distortion tends to increase toward the periphery of the micro mirror 62 from the center thereof. The rate of change of the distortion in the direction of one diagonal line (y direction) is larger than that in the direction of the other diagonal line (x direction), and the above tendency is more remarkable in the former direction than the latter direction.

In the image exposure system of this embodiment, the micro lens array 255 shown in FIG. 30 is applied to deal with the above problem. In the micro lens array 255, each of a number of micro lenses 255a arranged in an array has a circular lens aperture. Accordingly, the laser beam B reflected by the peripheral portion of the reflecting surface of the micro mirror 62, especially by the four corners of the reflecting surface of the micro mirror 62, is not collected by the micro lens 255a and the problem that the shape of the laser beam B collected by the micro lens of the micro lens array is distorted in the light collecting position can be avoided. With this arrangement, the photosensitive material 150 can be exposed to an image which is free from the distortion and higher in definition.

On the back side of the transparent member 255b (generally formed integrally with the micro lenses 255a) holding the micro lenses 255a of the micro lens array 255, that is, the side opposite to the side on which the micro lenses 255a are formed, a light-shielding mask 255c is formed to cover the areas outside the lens apertures of the micro lenses 255a spaced from each other. With such a mask 255c, the laser beam B reflected by the peripheral portion of the reflecting surface of the micro mirror 62, especially by the four corners of the reflecting surface of the micro mirror 62 is absorbed and shielded there. Accordingly, the problem that the shape of the collected laser beam B is distorted can be more surely prevented.

Figure 31:
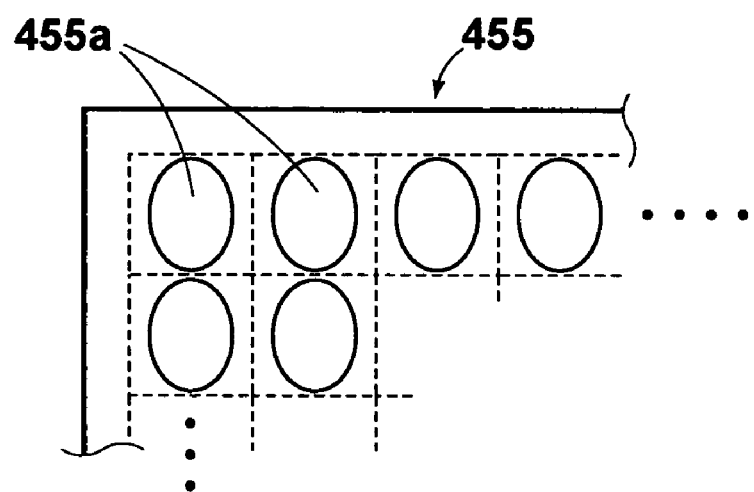
FIG. 31 is a plan view showing still another example of the micro lens array.
Figure 32:
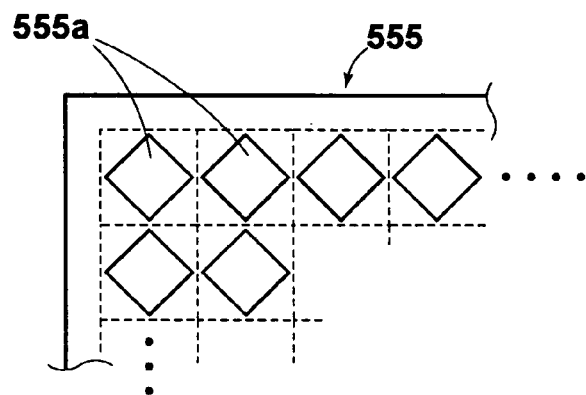
FIG. 32 is a plan view showing still another example of the micro lens array.

The shape of the aperture of the micro lenses need not be limited to a circle, but a micro lens array 455 comprising a number of micro lenses 455a having an ellipsoidal aperture as shown in FIG. 31 or a micro lens array 555 comprising a number of micro lenses 555a having a polygonal (tetragonal in this particular example) aperture as shown in FIG. 32 can also be employed. The micro lenses 455a and 555a are obtained by cutting a part of a normal spherical lens which is symmetrical about its optical axis into a circular or polygonal lens, and is equivalent in the light collecting function to a normal spherical lens which is symmetrical about its optical axis.

Figure 33A:
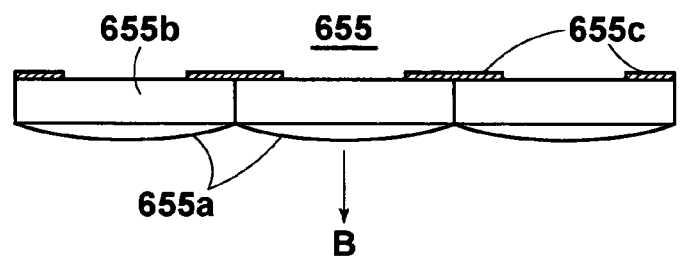
FIGS. 33A to 33C are side views respectively showing still other examples of the micro lens array.
Figure 33B:
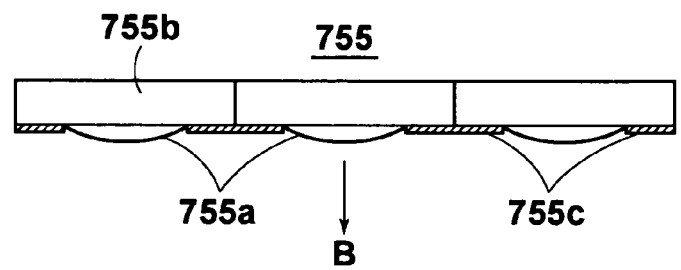
Figure 33C:
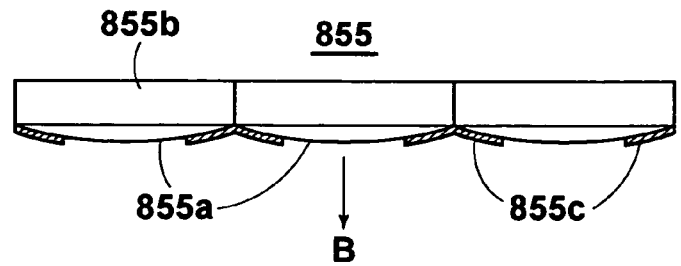

Further, micro lens arrays shown in FIGS. 33A to 33C can be employed. The micro lens array 655 shown in FIG. 33A comprises a number of micro lenses 655a provided on the side of a transparent member 655b from which the laser beam B is radiated to be in close contact with each other, and a mask 655c provided on the side of the transparent member 655b upon which the laser beam B impinges. The micro lens 655a may be the same as the micro lens 55a, 455a or 555a and the mask 655c may be the same as the mask 255c. The mask 255c shown in FIG. 30 is formed outside the lens aperture of the micro lens whereas the mask 655c is formed inside the lens aperture of the micro lens. The micro lens array 755 shown in FIG. 33B comprises a number of micro lenses 755a provided on the side of a transparent member 755b from which the laser beam B is radiated spaced from each other, and a mask 755c provided between the micro lenses 755a. The micro lens array 855 shown in FIG. 33C comprises a number of micro lenses 855a provided on the side of a transparent member 855b from which the laser beam B is radiated spaced from each other, and a mask 855c provided in the periphery of each of the micro lenses 855a.

The masks 655c, 755c and 855c all have circular openings as the mask 255c described above, whereby the aperture of the micro lenses is defined to be circular.

The arrangement where light from the periphery of the micro mirrors 62 of the DMD 50 is prevented from entering the micro lenses by providing a mask or the like as in the micro lenses 255a, 455a, 555a, 655a and 755a can be employed together with an aspherical lens shape which corrects aberration due to distortion of the surface of micro mirror 62 as in the micro lens 55a described above with reference to FIG. 20 or together with a refractive index profile which corrects the aberration as in the micro lens 155a described above with reference to FIG. 24. With this arrangement, the effect of preventing distortion of the exposed image due to distortion of the reflecting surface of the micro mirror 62 can be further enhanced.

Especially when the lens face of the micro lens 855a is provided with the mask 855c, the micro lens 855a has an aspherical lens shape or a refractive index profile described above, and at the same time, the imaging position of the first imaging optical system (e.g., consisting of lens systems 52 and 54 shown in FIG. 5) is on the lens face of the micro lens 855a, the light utilizing efficiency can be increased and the photosensitive material 150 can be exposed to more intensive light. That is, the light is refracted by the first imaging optical system so that the stray light due to distortion of the reflecting surface of the micro mirror 62 is converged on a point in the imaging position of the first imaging optical system. However, when the mask 855c is formed in this position, light other than the stray light cannot be cut, whereby the light utilizing efficiency can be increased.

Further, though, in the embodiments described above, the light source which projects light onto the spatial light modulator element is in the form of a laser, the light source need not be limited to the lasers and may be, for instance, a lamp such as a mercury vapor lamp.

Further, though, in the embodiments described above, aberration due to distortion of the reflecting surface of the micro mirror 62 forming the DMD 50 is corrected, the present invention can be applied to image exposure systems employing a spatial light modulator element other than the DMD to correct distortion of the shape of the beam.

What is claimed is:

1. An image exposure system comprising
a spatial light modulator element comprising a number of two-dimensionally arranged pixel portions each modulating light projected thereon,
a light source which projects light onto the spatial light modulator element and
an imaging optical system which includes a micro lens array and forms on a photosensitive material an image by light modulated by the spatial light modulator element, the micro lens array being made up of micro lenses which are arranged like an array and collect light from the pixel portions of the spatial light modulator element,
wherein the improvement comprises that each micro lens of the micro lens array is of an aspherical surface which corrects aberration due to distortion of the pixel portions.

2. An image exposure system as defined in claim 1 in which the aspherical surface is a toric surface.

3. An image exposure system as defined in claim 1 in which the imaging optical system comprises a first imaging optical system which forms an image by the light modulated by the spatial light modulator element on the micro lens array and the imaging position of the first imaging optical system is on the lens face of the micro lens array.

4. An image exposure system as defined in claim 1 in which the imaging optical system comprises a first imaging optical system which forms an image by the light modulated by the spatial light modulator element on the micro lens array and a second imaging optical system which forms an image by the light collected by the micro lens array on the photosensitive material, and an aperture array comprising a number of apertures arranged in an array each stopping the light emanating from the micro lens independently of other apertures is disposed between the micro lens array and the second imaging optical system.

5. An image exposure system as defined in claim 4 in which the aperture array is disposed on a focusing position of the micro lens.

6. An image exposure system as defined in claim 1 in which the spatial light modulator element is in the form of a DMD (digital micro mirror device) comprising a plurality of micro mirrors two-dimensionally arranged to form the pixel portions.

7. An image exposure method characterized in that a photosensitive material is exposed in a predetermined pattern by the use of the image exposure system of the image exposure system defined in claim 1.

8. The image exposure system as defined in claim 1, wherein in an optical path from the light source to the photosensitive material, the micro lens array is located in the optical path after the spatial light modulator element.

9. An image exposure system comprising
a spatial light modulator element comprising a number of two-dimensionally arranged pixel portions each modulating light projected thereon,
a light source which projects light onto the spatial light modulator element and
an imaging optical system which includes a micro lens array and forms on a photosensitive material an image by light modulated by the spatial light modulator element, the micro lens array being made up of micro lenses which are arranged like an array and collect light from the pixel portions of the spatial light modulator element,
wherein the improvement comprises that each micro lens of the micro lens array has a refractive index distribution which corrects aberration due to distortion of the pixel portions.

10. An image exposure system as defined in claim 9 in which the imaging optical system comprises a first imaging optical system which forms an image by the light modulated by the spatial light modulator element on the micro lens array and the imaging position of the first imaging optical system is on the lens face of the micro lens array.

11. An image exposure system as defined in claim 9 in which the imaging optical system comprises a first imaging optical system which forms an image by the light modulated by the spatial light modulator element on the micro lens array and a second imaging optical system which forms an image by the light collected by the micro lens array on the photosensitive material, and an aperture array comprising a number of apertures arranged in an array each stopping the light emanating from the micro lens independently of other apertures is disposed between the micro lens array and the second imaging optical system.

12. An image exposure system as defined in claim 11 in which the aperture array is disposed on a focusing position of the micro lens.

13. An image exposure system as defined in claim 9 in which the spatial light modulator element is in the form of a DMD (digital micro mirror device) comprising a plurality of micro mirrors two-dimensionally arranged to form the pixel portions.

14. An image exposure method characterized in that a photosensitive material is exposed in a predetermined pattern by the use of the image exposure system of the image exposure system defined in claim 9.

15. The image exposure system as defined in claim 9, wherein in an optical path from the light source to the photosensitive material, the micro lens array is located in the optical path after the spatial light modulator element.

16. An image exposure system comprising
a spatial light modulator element comprising a number of two-dimensionally arranged pixel portions each modulating light projected thereon,
a light source which projects light onto the spatial light modulator element and
an imaging optical system which includes a micro lens array and forms on a photosensitive material an image by light modulated by the spatial light modulator element, the micro lens array being made up of micro lenses which are arranged like an array and collect light from the pixel portions of the spatial light modulator element,
wherein the improvement comprises that each micro lens of the micro lens array has a shape of lens aperture which does not permit light from a periphery of each of the pixel portions of the spatial light modulator element.

17. An image exposure system as defined in claim 16 in which each micro lens of the micro lens array is of an aspherical surface which corrects aberration due to distortion of the pixel portions.

18. An image exposure system as defined in claim 17 in which the aspherical surface is a tone surface.

19. An image exposure system as defined in claim 16 in which each micro lens of the micro lens array has a refractive index distribution which corrects aberration due to distortion of the pixel portions.

20. An image exposure system as defined in claim 16 in which each micro lens of the micro lens array has a circular lens aperture.

21. An image exposure system as defined in claim 16 in which the shape of lens aperture of each micro lens of the micro lens array is defined by a light-shielding portion provided on a part of its lens face.

22. An image exposure system as defined in claim 16 in which the imaging optical system comprises a first imaging optical system which forms an image by the light modulated by the spatial light modulator element on the micro lens array and the imaging position of the first imaging optical system is on the lens face of the micro lens array.

23. An image exposure system as defined in claim 16 in which the imaging optical system comprises a first imaging optical system which forms an image by the light modulated by the spatial light modulator element on the micro lens array and a second imaging optical system which forms an image by the light collected by the micro lens array on the photosensitive material, and an aperture array comprising a number of apertures arranged in an array each stopping the light emanating from the micro lens independently of other apertures is disposed between the micro lens array and the second imaging optical system.

24. An image exposure system as defined in claim 23 in which the aperture array is disposed on a focusing position of the micro lens.

25. An image exposure system as defined in claim 16 in which the spatial light modulator element is in the form of a DMD (digital micro mirror device) comprising a plurality of micro mirrors two-dimensionally arranged to form the pixel portions.

26. An image exposure method characterized in that a photosensitive material is exposed in a predetermined pattern by the use of the image exposure system of the image exposure system defined in claim 16.

27. The image exposure system as defined in claim 16, wherein in an optical path from the light source to the photosensitive material, the micro lens array is located in the optical path after the spatial light modulator element.

28. An image exposure system comprising:
a spatial light modulator element comprising a number of two-dimensionally arranged pixel portions each modulating light projected thereon,
a light source which projects light onto the spatial light modulator element; and
an imaging optical system which includes a micro lens array and forms on a photosensitive material an image by light modulated by the spatial light modulator element, the micro lens array being made up of micro lenses which are arranged like an array and collect light from the pixel portions of the spatial light modulator element,
wherein each micro lens of the micro lens array comprises a means for correcting aberration due to distortion of the pixel portions.

29. An image exposure system comprising:
a spatial light modulator element comprising a number of two-dimensionally arranged pixel portions each modulating light projected thereon,
a light source which projects light onto the spatial light modulator element; and
an imaging optical system which forms on a photosensitive material an image by light modulated by the spatial light modulator element,
the imaging optical system comprising a micro lens array including two-dimensionally arranged micro lenses, each including an aspherical surface or a refractive index distribution so as to correct aberration due to distortion of the pixel portions.

* * * * *